(12) United States Patent
Ikeda et al.

(10) Patent No.: US 8,467,228 B2
(45) Date of Patent: Jun. 18, 2013

(54) VARIABLE RESISTANCE NONVOLATILE MEMORY DEVICE

(75) Inventors: Yuichiro Ikeda, Hyogo (JP); Kazuhiko Shimakawa, Osaka (JP); Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/496,895

(22) PCT Filed: Aug. 10, 2011

(86) PCT No.: PCT/JP2011/004540
§ 371 (c)(1),
(2), (4) Date: Mar. 19, 2012

(87) PCT Pub. No.: WO2012/023266
PCT Pub. Date: Feb. 23, 2012

(65) Prior Publication Data
US 2012/0176834 A1    Jul. 12, 2012

(30) Foreign Application Priority Data

Aug. 19, 2010    (JP) .................................. 2010-184456

(51) Int. Cl.
*G11C 11/00*    (2006.01)
(52) U.S. Cl.
USPC ........................................................ 365/148
(58) Field of Classification Search
USPC ................. 365/46, 51, 52, 94, 100, 129, 148, 365/158, 163; 257/2–4, E21.35; 438/135
See application file for complete search history.

(56) References Cited

U.S. PATENT DOCUMENTS

| 6,917,532 | B2 | 7/2005 | Van Brocklin et al. |
| 7,394,680 | B2 | 7/2008 | Toda et al. |
| 7,400,522 | B2 | 7/2008 | Toda et al. |

(Continued)

FOREIGN PATENT DOCUMENTS

| JP | 2004-031948 | 1/2004 |
| JP | 2005-311322 | 11/2005 |

(Continued)

OTHER PUBLICATIONS

International Search Report issued Sep. 13, 2011 in International (PCT) Application No. PCT/JP2011/004540.

(Continued)

*Primary Examiner* — Harry W Byrne
(74) *Attorney, Agent, or Firm* — Wenderoth, Lind & Ponack, L.L.P.

(57) ABSTRACT

Each of basic array planes has a first via group that interconnects only even-layer bit lines in the basic array plane, and a second via group that interconnects only odd-layer bit lines in the basic array plane, the first via group in a first basic array plane and the second via group in a second basic array plane adjacent to the first basic array in a Y direction are adjacent to each other in the Y direction, and the second via group in the first basic array plane and the first via group in the second basic array plane are adjacent to each other in the Y direction, and the second via group in the second basic array plane is disconnected from a second global line when connecting the first via group in the first basic array plane to a first global line.

5 Claims, 35 Drawing Sheets

U.S. PATENT DOCUMENTS

| | | |
|---|---|---|
| 7,606,059 B2 | 10/2009 | Toda |
| 7,692,951 B2 | 4/2010 | Toda et al. |
| 7,778,062 B2 | 8/2010 | Toda et al. |
| 7,826,249 B2 | 11/2010 | Toda |
| 7,911,854 B2 | 3/2011 | Nagashima et al. |
| 7,920,408 B2 | 4/2011 | Azuma et al. |
| 8,064,272 B2 | 11/2011 | Nagashima et al. |
| 2003/0235063 A1 | 12/2003 | Van Brocklin et al. |
| 2005/0230724 A1 | 10/2005 | Hsu |
| 2006/0268594 A1* | 11/2006 | Toda .................. 365/100 |
| 2007/0132049 A1 | 6/2007 | Stipe |
| 2007/0285966 A1 | 12/2007 | Toda et al. |
| 2007/0285967 A1 | 12/2007 | Toda et al. |
| 2007/0285968 A1 | 12/2007 | Toda et al. |
| 2008/0304308 A1 | 12/2008 | Stipe |
| 2008/0310211 A1 | 12/2008 | Toda et al. |
| 2009/0052225 A1 | 2/2009 | Morimoto |
| 2009/0168493 A1* | 7/2009 | Kim et al. .................. 365/148 |
| 2009/0219740 A1 | 9/2009 | Nagashima et al. |
| 2010/0046273 A1* | 2/2010 | Azuma et al. .................. 365/148 |
| 2010/0165702 A1 | 7/2010 | Toda |
| 2010/0321982 A1 | 12/2010 | Takagi et al. |
| 2011/0019462 A1 | 1/2011 | Toda |
| 2011/0134681 A1 | 6/2011 | Nagashima et al. |
| 2011/0238902 A1 | 9/2011 | Ishikawa et al. |

FOREIGN PATENT DOCUMENTS

| | | |
|---|---|---|
| JP | 2006-514393 | 4/2006 |
| JP | 2006-203098 | 8/2006 |
| JP | 2007-165873 | 6/2007 |
| JP | 2009-230849 | 10/2009 |
| WO | 2004/084229 | 9/2004 |
| WO | 2009/001534 | 12/2008 |
| WO | 2010/061760 | 6/2010 |
| WO | 2010/070895 | 6/2010 |

OTHER PUBLICATIONS

I. G. Baek. et al., "Multi-layer Cross-point Binary Oxide Resistive Memory(OxRRAM) for Post-NAND Storage Application", IEDM2005 (IEEE international Electron Devices meeting 2005), Session 31, Dec. 5, 2005.

* cited by examiner

When accessing BL_e2

When accessing BL_e3

When accessing BL_e2

When accessing BL_e3

VARIABLE RESISTANCE NONVOLATILE MEMORY DEVICE

TECHNICAL FIELD

The present invention relates to a variable resistance nonvolatile memory device having memory cells that use so-called variable resistance elements.

BACKGROUND ART

In recent years, progressive research and development has been conducted on variable resistance nonvolatile memory devices having memory cells that use so-called variable resistance elements (hereinafter, also simply referred to as "nonvolatile memory devices"). A variable resistance element is an element that has a property of changing its resistance value according to an electrical signal, and enables information to be written due to such a change in the resistance value.

One structure of memory cells that use variable resistance elements is a crosspoint structure. In the crosspoint structure, each memory cell is placed at a different one of crosspoints of orthogonally arranged bit lines and word lines so as to be interposed between a corresponding one of the bit lines and a corresponding one of the word lines. Conventionally, various configurations of a nonvolatile memory device having such a crosspoint structure have been proposed (Patent Literatures (PTLs) 1 to 6, Non-Patent Literature (NPL) 1, etc.).

PTL 1 discloses a nonvolatile memory device that uses bidirectional variable resistors as memory cells. PTL 1 discloses that a varistor, for example, is used for a diode of a memory cell, as a bidirectional nonlinear element, in order to reduce a so-called leakage current that flows into unselected cells. PTL 1 also discloses the crosspoint structure.

PTL 2 discloses a nonvolatile memory device including a three-dimensional crosspoint variable resistance memory cell array having a multilayer structure.

NPL 1 discloses a memory cell structure having a combination of a variable resistance film and a unidirectional diode. NPL 1 also discloses a multilayer structure.

PTL 3 discloses a multilayer memory structure in which memory cells including Zener diodes and variable resistance memory elements that can be rewritten with a bipolar voltage are used.

PTL 4 discloses a multilayer memory structure using memory cells including memory elements and unidirectional control elements.

PTL 5 discloses a nonvolatile memory that has a three-dimensional structure, and uses memory cells having polysilicon diodes and including variable-resistance memory elements (RRAMs) that can be rewritten with a unipolar voltage. As shown in FIG. 22, PTL 5 discloses a word line structure in which odd-layer word lines and even-layer word lines within the same array plane are respectively connected to different vertical wires (tree trunks). Here, odd-layer word lines and even-layer word lines in a certain array plane are respectively connected to different drive circuits via drivers. Further, a driver that selects odd-layer word lines and a driver that selects even-layer word lines in a certain array plane, and a driver that selects odd-layer word lines and a driver that selects even-layer word lines in an array plane adjacent to the certain array plane are each controlled by different control signals. It should be noted that although PTL 5 discloses the case of word lines, it is easily inferred that such a structure can be applied to bit lines rather than word lines.

CITATION LIST

[Patent Literature]
[PTL 1] Japanese Unexamined Patent Application Publication No. 2006-203098 (FIGS. 2 and 5)
[PTL 2] Japanese Unexamined Patent Application Publication No. 2005-311322 (FIG. 4)
[PTL 3] Japanese Unexamined Patent Application Publication No. 2006-514393
[PTL 4] Japanese Unexamined Patent Application Publication No. 2004-31948
[PTL 5] Japanese Unexamined Patent Application Publication No. 2007-165873 (FIGS. 5 and 9)
[PTL 6] International Patent Application Publication No. 2009/001534 [Non Patent Literature]
[NPL 1] Baek, I. G. et al., "Multi-layer Cross-point Binary Oxide Resistive Memory (OxRRAM) for Post-NAND Storage Application" IEDM2005 (IEEE International Electron Devices Meeting 2005), Dec. 5, 2005, pp. 769-772, Session 31 (FIGS. 7 and 11)

SUMMARY OF INVENTION

Technical Problem

However, there is a problem that when a conventional nonvolatile memory device as described above is realized as an integrated circuit, high integration is difficult due to an increase in the layout area therefor.

For example, in the structure described in PTL 5, a driver (selection switch) that selects odd-layer word lines and a driver (selection switch) that selects even-layer word lines within the same array plane are respectively controlled by different control signals and connected to different drive circuits. Further, drivers (selection switches) in a certain array plane and those in an array plane adjacent to that array plane are respectively controlled by different control signals and connected to different drive circuits. Therefore, four drivers (selection switches) are necessary for two array planes, and in addition, the four drivers (selection switches) need to be respectively connected to different drive circuits, and one terminal of each of the drivers (selection switches) cannot be shared. Thus, the layout area for the drivers (selection switches) is increased, which results in a problem of difficulty in high integration of a nonvolatile memory device.

To address this problem, PTL 6 discloses that with a hierarchical bit line structure in which odd-layer bit lines and even-layer bit lines within the same array plane are respectively connected to common contact vias, the contact vias to which the odd-layer bit lines and the even-layer bit lines are connected are further selected using respective selection switches, and one diffusion region of each of the selection switches is shared, thereby enabling suppression of an increase in a layout area. Furthermore, PTL 6 also discloses that gates of selection switches for odd-layer bit lines in a plurality of planes are commonly connected, and similarly gates of selection switches for even-layer bit lines are commonly connected, thereby constituting blocks, and accesses are made on a block-by-block basis, and thus the layout area can be reduced.

Here, in designing of a memory cell array in general, the to area therefor is required to be decreased as much as possible, and bit lines and word lines are each wired at minimum intervals allowed in the implementing process. However, since capacitive coupling between lines is greatly increased, a signal is transmitted to an unselected bit line or word line adjacent to the selected bit line and word line due to capacitive coupling, which exerts an influence on the behavior of a signal in the selected bit line and word line. With the structure disclosed in PTL 6 (FIG. 23), in a basic array plane group 400, the behavior of a signal in an unselected bit line adjacent to a selected bit line is different in the case of selecting a memory cell in an array plane located in an inner part of a block and in the case of selecting a memory cell in an array plane located at the end portion of the block, and thus even when the resistance value written in the memory cells is the same, there is a difference in the behavior of signals in selected lines depending on the position of the selected memory cells, and variations in read speed occur, which is a problem (details of this operation will be described below). Accordingly, it is necessary to take one of the following measures, namely, designing a circuit with a margin for the variation provided in the read speed and designing a layout with a margin provided in the wiring intervals between bit lines and in the wiring intervals between word lines.

In view of the problem stated above, an object of the present invention is to provide a nonvolatile memory device that uses variable resistance nonvolatile memory elements, the device enabling the wiring of bit lines and word lines of a memory cell array at minimum intervals allowed in the implementing process, without providing a margin in the design of a read circuit.

Solution to Problem

In order to achieve the above object, a variable resistance nonvolatile memory device according to an aspect of the present invention is a variable resistance nonvolatile memory device including memory cells each having a variable resistance element, a resistance state of which reversibly changes based on an electrical signal, the device including: a substrate; bit lines in a plurality of layers which are stacked in a Z direction, and in which the bit lines extending in an X direction are aligned in a Y direction, the X and Y directions being directions orthogonal to each other on a plane parallel to a main surface of the substrate, and the Z direction being a direction in which the layers are stacked above the main surface of the substrate; word lines in a plurality of layers which are stacked in the Z direction and formed at respective intervals between the layers of the bit lines, and in which the word lines extending in the Y direction are aligned in the X direction; a memory cell array having the memory cells which are formed at respective crosspoints of the bit lines in the layers and the word lines in the layers, and each of which is interposed between a corresponding one of the bit lines and a corresponding one of the word lines, the memory cell array including a plurality of basic array planes aligned in the Y direction, and each of the basic array planes having memory cells included in the memory cells and interposed between, among the bit lines in the layers, bit lines in the layers at the same position in the Y direction and the word lines crossing the bit lines at the same position; global bit lines provided in one-to-one correspondence with the basic array planes; and sets of a first selection switch element and a second selection switch element, the sets being provided in one-to-one correspondence with the basic array planes, wherein each of the basic array planes further includes a first via group interconnecting only even-layer bit lines among the bit lines in the basic array plane, and a second via group interconnecting only odd-layer bit lines among the bit lines in the basic array plane, and for each of the basic array planes, the first via group in the basic array plane is connected to the global bit line corresponding to the basic array plane via one of the first selection switch element and the second selection switch element that are included in the set corresponding to the basic array plane, and the second via group in the basic array plane is connected to the corresponding global bit line via the other of the first selection switch element and the second selection switch element that are included in the corresponding set, and when one of the basic array planes is a first basic array plane, and a different one of the basic array planes is a second basic array plane, the different one being adjacent to the first basic array plane in the Y direction, the first via group in the first basic array plane and the second via group in the second basic array plane are adjacent to each other in the Y direction, and the second via group in the first basic array plane and the first via group in the second basic array plane are adjacent to each other in the Y direction, the first via group in the first basic array plane is connected to the global bit line corresponding to the first basic array plane via the first selection switch element corresponding to the first basic array plane, and the second via group in the first basic array plane is connected to the corresponding global bit line via the second selection switch element corresponding to the first basic array plane, the second via group in the second basic array plane is connected to the global bit line corresponding to the second basic array plane via the first selection switch element corresponding to the second basic array plane, and the first via group in the second basic array plane is connected to the corresponding global bit line via the second selection switch element corresponding to the second basic array plane, and in the sets which correspond to the basic array planes, and each of which includes the first selection switch element and the second selection switch element, electrical connection and disconnection of the first selection switch elements are controlled by a first common bit line selection signal, and electrical connection and disconnection of the second selection switch elements are controlled by a second common bit line selection signal.

Accordingly, the first via group in the first basic array plane and the second via group in the second basic array plane adjacent to the first basic array plane in the Y direction are adjacent to each other in the Y direction, and the second via group in the first basic array plane and the first via group in the second basic array plane are adjacent to each other in the Y direction, and thus irrespective of the position of a bit line to be selected, an unselected bit line adjacent to the selected bit line in the same wiring layer (i.e., in the Y direction) is disconnected from a global bit line. Consequently, a problem does not occur that the behavior of a signal in the selected bit line differs depending on the position of the selected bit line. Therefore, bit lines and word lines of a memory cell array can be wired at minimum intervals allowed in the implementing process, without providing a margin in the design of a read circuit.

Here, for each of the basic array planes, the first via group in the basic array plane may connect all the even-layer bit lines in the basic array plane using a single via, and the second via group in the basic array plane may connect all the odd-layer bit lines in the basic array plane using a single via, the even-layer bit lines being adjacent to each other in the Z direction with the odd-layer bit lines in the basic array plane interposed, and the odd-layer bit lines being adjacent to each other in the Z direction with the even-layer bit lines in the basic array plane interposed. Accordingly, by causing the first via group to have a single through via structure, an odd-layer through via is not formed at the point in time when forming even-layer bit lines, and thus an interval between sets of even-layer bit lines in via regions is twice as much as the interval between basic array planes, thereby allowing a process to be performed with ease. Similarly, by causing the second via group to have a single through via structure, an even-layer through via is not formed at the point in time when forming odd-layer bit lines, and thus an interval between sets of odd-layer bit lines in via regions is twice as much as the interval between basic array planes, thereby allowing a process to be performed with ease.

For each of the basic array planes, the variable resistance nonvolatile memory device may further include a current limiting circuit between the global bit line corresponding to the basic array plane and terminals, one of the terminals being a terminal of the first selection switch element corresponding to the basic array plane and the other of the terminals being a terminal of the second selection switch element corresponding to the basic array plane. Accordingly, a current limiting circuit is inserted between a corresponding global bit line and the first and second selection switch elements, and thus a problem is prevented that, for example, the resistance of the variable resistance element is excessively decreased, which causes the subsequent operation to be unstable.

The variable resistance nonvolatile memory device may further include: a global bit line decoder/driver that selects at least one of the global bit lines, and applies a read voltage to the at least one selected global bit line; a read circuit that reads the resistance state of a memory cell in the basic array plane corresponding to the at least one global bit line selected by the global bit line decoder/driver; and a control circuit that controls the global bit line decoder/driver, wherein when an operation of reading from a memory cell in the first basic array plane is performed, the control circuit may control the global bit line decoder/driver such that an operation of reading from a memory cell in the second basic array plane is prevented from being simultaneously performed. At this time, it is preferable that when the operation of reading from a memory cell in the first basic array plane is performed, the control circuit further controls the global bit line decoder/driver such that an operation of reading from a memory cell in a third basic array plane is simultaneously performed, the third basic array plane not being adjacent to the first basic array plane in the Y direction. Accordingly, when memory cells in a plurality of given basic array planes in a basic array plane group are simultaneously selected (read), a bit line adjacent to each selected bit line in the Y direction is always an unselected bit line, and thus a problem does not occur that the behavior of a signal in an adjacent line in the Y direction differs depending on the position of a memory cell (bit line) to be selected, which causes variations in a read speed.

Advantageous Effects of Invention

According to the present invention, a variable resistance nonvolatile memory device that includes a memory cell array with a multi-layer stack structure can be constituted using minimum wiring intervals allowed in a process to be implemented as an integrated circuit, and thus the area therefor can be decreased.

DESCRIPTION OF EMBODIMENTS

The following is a detailed description of an embodiment of a variable resistance nonvolatile memory device according to the present invention, with reference to drawings.

<Configuration of Variable Resistance Nonvolatile Memory Device According to Present Invention>

Figure 1A:
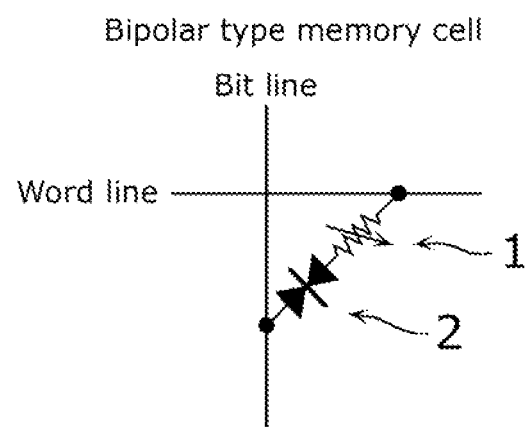
FIG. 1A is a circuit diagram of a bipolar type memory cell in an embodiment of the present invention.

FIG. 1A is a circuit diagram of a memory cell (crosspoint memory cell) included in a variable resistance nonvolatile memory device in the present embodiment. As shown in FIG. 1A, in the present embodiment, bipolar type memory cells are assumed to be used whose resistance value changes due to application of voltages or currents that are of different polarities and greater than or equal to a predetermined threshold value. Each bipolar type memory cell includes a variable resistance nonvolatile memory element 1 whose resistance changes due to bidirectional current or voltage application (hereinafter, also referred to as variable resistance element 1) and a bidirectional diode element 2 connected to the variable resistance element 1 in series. The variable resistance element 1 can be at least in a low resistance state and a high resistance state, and write information according to a reversible change in the resistance value (resistance state) based on an applied electrical signal. Specifically, the variable resistance element 1 has a property of changing its state to the high resistance state when an absolute value of a voltage applied to the variable resistance element 1 in the low resistance state exceeds a first predetermined voltage, and changing its state to the low resistance state when an absolute value of a voltage applied to the variable resistance element 1 in the high resistance state in a direction opposite (reverse polarity) to the direction in which the first voltage is applied (application polarity) exceeds a second predetermined voltage. The bidirectional diode element 2 has a nonlinear current characteristic with respect to an applied voltage and is bidirectional, thus allowing a current to flow bidirectionally (into a positive voltage region and a negative voltage region).

Figure 2:
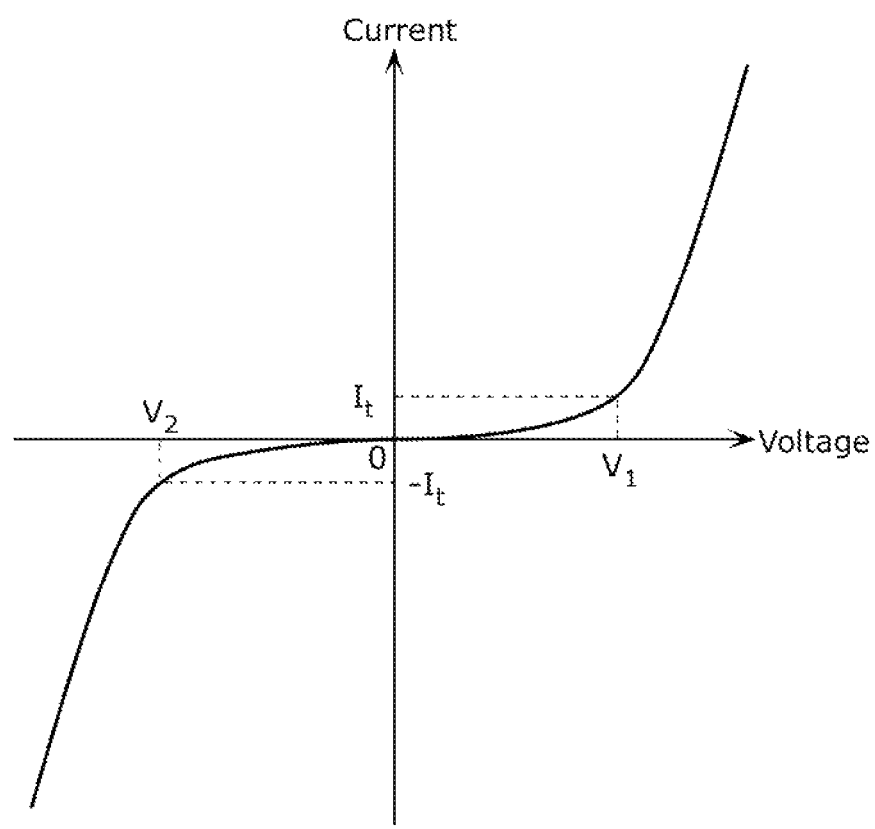
FIG. 2 is a graph showing an example of a voltage-current characteristic of a bidirectional diode element.

FIG. 2 shows an example of a voltage-current characteristic of the bidirectional diode element 2. $I_t$ (>0) represents a predetermined current value for determining a threshold voltage, $V_1$ represents a first threshold voltage (positive threshold voltage), and $V_2$ represents a second threshold voltage (negative threshold voltage). As shown in FIG. 2, this characteristic is nonlinear, and a resistance is high in a region in which voltage V satisfies $V_2 < V < V_1$, which substantially prevents a current from flowing. At this time, assuming that a current that flows through the bidirectional diode element 2 is I, I satisfies the following relationship:

$$-I_t < I < I_t$$

In contrast, in a region in which voltage V satisfies $V \leq V_2$ or $V_1 \leq V$, a resistance value falls rapidly, which allows a large current to flow. At this time, $I_t \leq I$ is satisfied in a region in which $V_1 \leq V$, and $I \leq -I_t$ is satisfied in a region in which $V \leq V_2$.

Here, a threshold voltage means a voltage applied when a predetermined current flows. A predetermined current here has a value that can be arbitrarily determined in order to determine a threshold voltage, and is determined according to a characteristic of an element controlled by a diode, and a characteristic of a diode. Normally, a current at the point in time when a state in which a current does not substantially flow is shifted to a state in which a large current flows is determined as a threshold current.

It should be noted that although the magnitude of a current at the time of positive voltage and the magnitude of a current at the time of negative voltage are illustrated to have origin symmetry in FIG. 2, these do not necessarily need to be symmetrical. For example $|V_1|$ may be smaller than $|V_2|$, or $|V_2|$ may be smaller than $|V_1|$.

A memory element is realized using a bipolar type memory cell provided between a bit line and a word line.

Figure 1B:
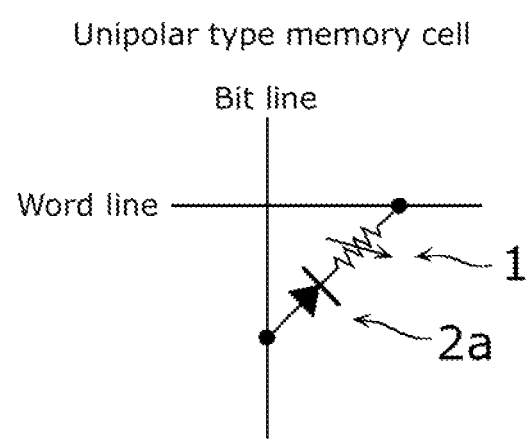
FIG. 1B is a circuit diagram of a unipolar type memory cell in the embodiment of the present invention.
Figure 1C:
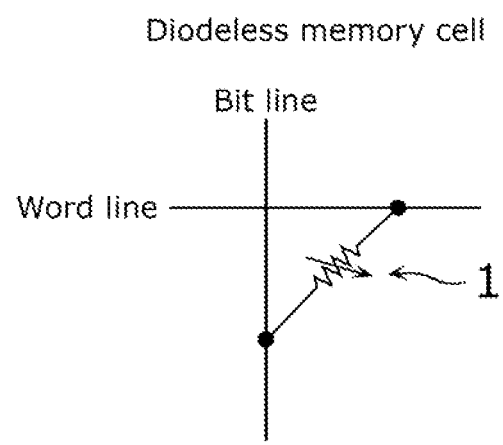
FIG. 1C is a circuit diagram of a diodeless memory cell in the embodiment of the present invention.

It should be noted that a unipolar type memory cell including the variable resistance element 1 and a unidirectional diode element 2a as shown in FIG. 1B or a diodeless memory cell including only the variable resistance element 1 as shown in FIG. 1C can be adopted as a configuration of a memory cell included in a variable resistance nonvolatile memory device according to the present invention.

Here, one terminal of the variable resistance element is connected to a bit line, the other terminal of the variable resistance element and one terminal of the diode element are connected to each other, and the other terminal of the diode element is connected to a word line in FIGS. 1A and 1B; however, one terminal of the variable resistance element may be connected to a word line, the other terminal of the variable resistance element and one terminal of the diode element may be connected to each other, and the other terminal of the diode element may be connected to a bit line.

Figure 3A:
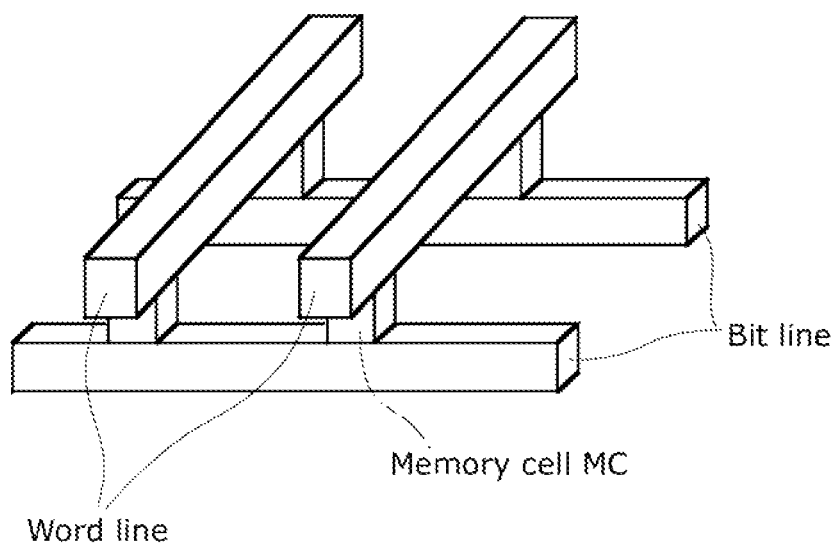
FIG. 3A shows a single-layer crosspoint structure.
Figure 3B:
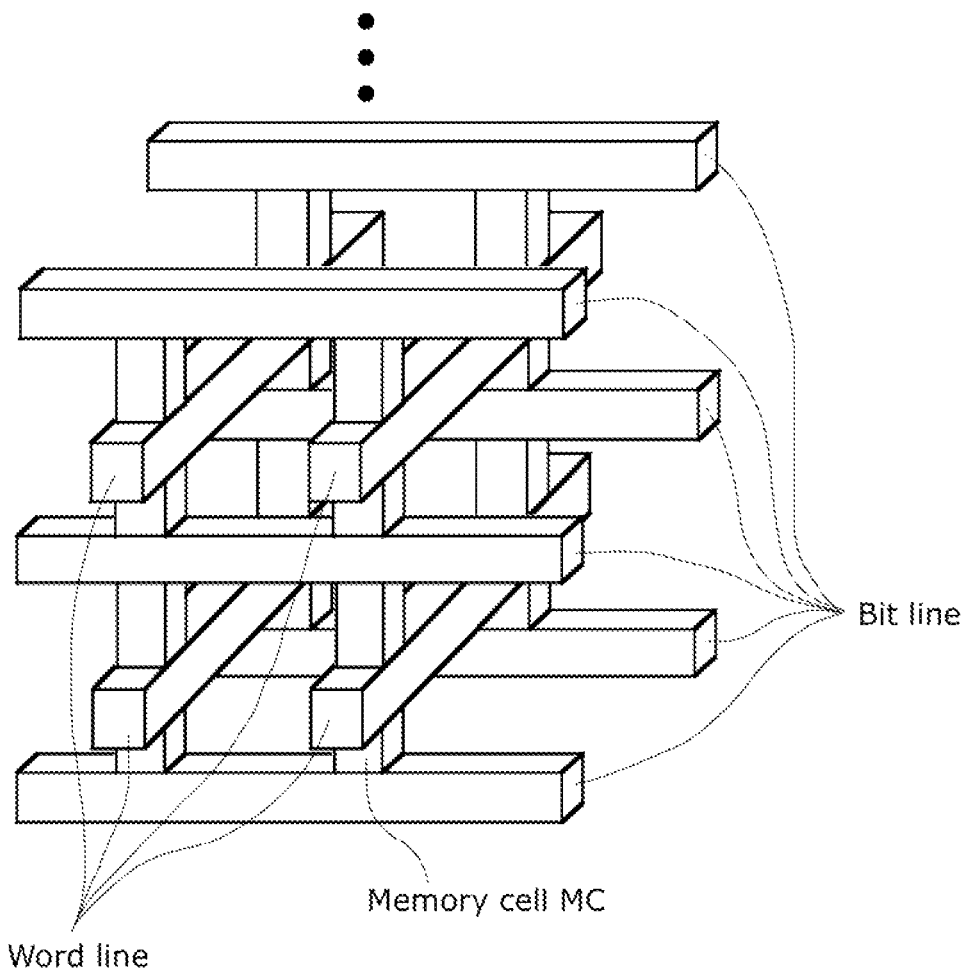
FIG. 3B shows a multilayer crosspoint structure.

FIGS. 3A and 3B are conceptual diagrams showing a three-dimensional structure including memory cells. FIG. 3A shows a three-dimensional structure which includes so-called single-layer crosspoint memory cells, and in which each memory cell MC is placed at a different one of crosspoints between bit lines and word lines that are orthogonally arranged so as to be interposed between a corresponding one of the bit lines and a corresponding one of the word lines. FIG. 3B shows a three-dimensional structure which includes so-called multilayer crosspoint memory cells, and in which the single-layer crosspoint memory cells in FIG. 3A are stacked.

Figure 4A:
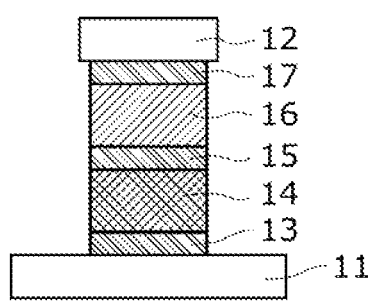
FIG. 4A shows an example of a cross-sectional structure of a memory cell in the embodiment of the present invention.

FIG. 4A shows an example of the cross-sectional structure of various memory cells in the present embodiment. In FIG.

4A, one of a lower wire 11 and an upper wire 12 is a bit line, and the other is a word line. Further, a lower electrode 13, a diode layer 14, an internal electrode 15, a variable resistance layer 16, and an upper electrode 17 are formed between the lower wire 11 and the upper wire 12, in this stated order. Specifically, in the configuration in FIG. 4A, the diode element 2 is composed of the lower electrode 13, the diode layer 14, and the internal electrode 15, and the variable resistance element 1 is composed of the internal electrode 15, the variable resistance layer 16, and the upper electrode 17.

It should be noted that an oxygen-deficient transition metal oxide can be used for the variable resistance layer 16. When a tantalum oxide is used for the transition metal oxide, and the composition thereof is expressed by $TaO_x$, at least $0<x<2.5$ needs to be satisfied. Specifically, the oxygen content needs to be lower than that of $Ta_2O_5$, which is a stoichiometric composition. In particular, a $TaO_x$ film where $0.8 \leq x \leq 1.9$ is desirable in the present embodiment.

A hafnium oxide or a zirconium oxide can be used as another transition metal oxide. When the composition of a hafnium oxide is expressed by $HfO_x$, at least $0<x<2.0$ needs to be satisfied. Furthermore, $0.9 \leq x \leq 1.6$ is desirable.

When the composition of a zirconium oxide is expressed by $ZrO_x$, at least $0<x<2.0$ needs to be satisfied. Furthermore, $0.9 \leq x \leq 1.4$ is desirable.

Figure 4B:
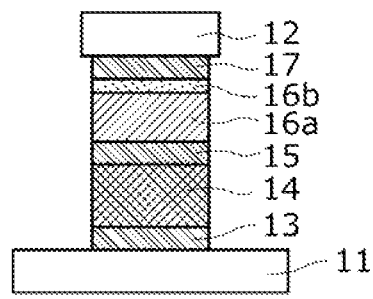
FIG. 4B shows an example of a cross-sectional structure of a memory cell in the embodiment of the present invention.

FIG. 4B shows another example of the cross-sectional structure of a memory cell in the present embodiment, and the variable resistance layer 16 has a stack structure. Specifically, the variable resistance layer 16 has a stack structure including a first variable resistance layer 16a and a second variable resistance layer 16b. Here, the second variable resistance layer 16b has a higher oxygen content and is thinner than the first variable resistance layer 16a. For example, when a tantalum oxide is used, the stack structure includes a first tantalum oxide layer (composition: $TaO_x$) 16a and a second tantalum oxide layer (composition: $TaO_y$) 16b. Here, it is preferable that $0<x<2.5$ and $x<y$ are satisfied. More suitably, it is preferable that the second tantalum oxide layer ($TaO_y$) 16b is in contact with the upper electrode 17, and has a thickness of 1 nm to 8 nm inclusive, and $0.8 \leq x \leq 1.9$ and $2.1 \leq y$ are satisfied.

When a hafnium oxide is used for the variable resistance layer of the stack structure, the stack structure includes a first hafnium oxide layer (composition: $HfO_x$) 16a and a second hafnium oxide layer (composition: $HfO_y$) 16b. Here, it is preferable that $0<x<2.0$ and $x<y$ are satisfied. More suitably, it is preferable that the second hafnium oxide layer ($HfO_y$) 16b is in contact with the upper electrode 17, and has a thickness of 3 nm to 4 nm inclusive, and $0.9 \leq x \leq 1.6$ and $1.8<y$ are satisfied.

When a zirconium oxide is used for the variable resistance layer of the stack structure, the stack structure includes a first zirconium oxide layer (composition: $ZrO_x$) 16a and a second zirconium oxide layer (composition: $ZrO_y$) 16b. Here, it is preferable that $0<x<2.0$ and $x<y$ are satisfied. More suitably, it is preferable that the second zirconium oxide layer ($ZrO_y$) 16b is in contact with the upper electrode 17, and has a thickness of 1 nm to 5 nm inclusive, and $0.9 \leq x \leq 1.4$ and $1.9<y$ are satisfied.

Here, it is preferable that the upper electrode 17 in contact with the second variable resistance layer 16b comprises one or more materials, such as, for example, Au (gold), Pt (platinum), Ir (iridium), Pd (palladium), Cu (copper), and Ag (silver), each of which has a standard electrode potential higher than the standard electrode potential of the metal of the second variable resistance layer 16b (e.g., Ta, Hf, or Zr), and the internal electrode 15 comprises a material (such as, e.g., W, Ni, or TaN) having a standard electrode potential lower than the standard electrode potential of the material of the upper electrode 17.

Figure 4C:
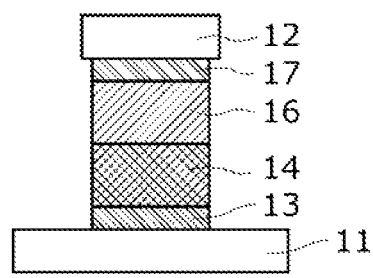
FIG. 4C shows an example of a cross-sectional structure of a memory cell in the embodiment of the present invention.
Figure 4D:
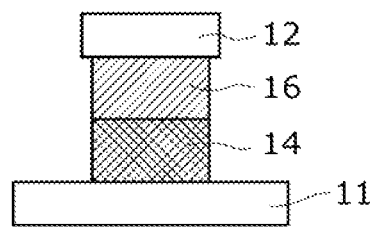
FIG. 4D shows an example of a cross-sectional structure of a memory cell in the embodiment of the present invention.

FIGS. 4C and 4D show other examples of the cross-sectional structure of memory cells in the present embodiment. The internal electrode 15 is excluded in FIG. 4C, and in FIG. 4D, the lower electrode 13 and the upper electrode 17 are further excluded, and the lower wire 11 and the upper wire 12 also serve as the lower electrode and the upper electrode, respectively. In the configuration of FIG. 4C, the diode element 2 is composed of the lower electrode 13, the diode layer 14, and the variable resistance layer 16 (also serving as the other electrode of the diode element 2), and the variable resistance element 1 is composed of the diode layer 14 (also serving as the other electrode of the variable resistance element 1), the variable resistance layer 16, and the upper electrode 17. In the configuration of FIG. 4D, the diode element 2 is composed of the lower wire 11, the diode layer 14, and the variable resistance layer 16 (also serving as the other electrode of the diode element 2), and the variable resistance element 1 is composed of the diode layer 14 (also serving as the other electrode of the variable resistance element 1), the variable resistance layer 16, and the upper wire 12.

The material that can be used is limited as the structure of a memory cell is further simplified.

Figure 4E:
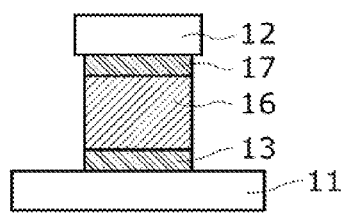
FIG. 4E shows an example of a cross-sectional structure of the diodeless memory cell in FIG. 1C.

FIG. 4E shows an example of the cross-sectional structure of the diodeless memory cell in FIG. 1C. It should be noted that it is possible to form the variable resistance layer 16 in the stack structure in all of FIGS. 4C, 4D, and 4E, as in FIG. 4B. It should be noted that although FIGS. 4A to 4E show a structure in which the variable resistance element is disposed over the diode element, a configuration may be adopted in which the diode element is disposed over the variable resistance element.

Figure 5:
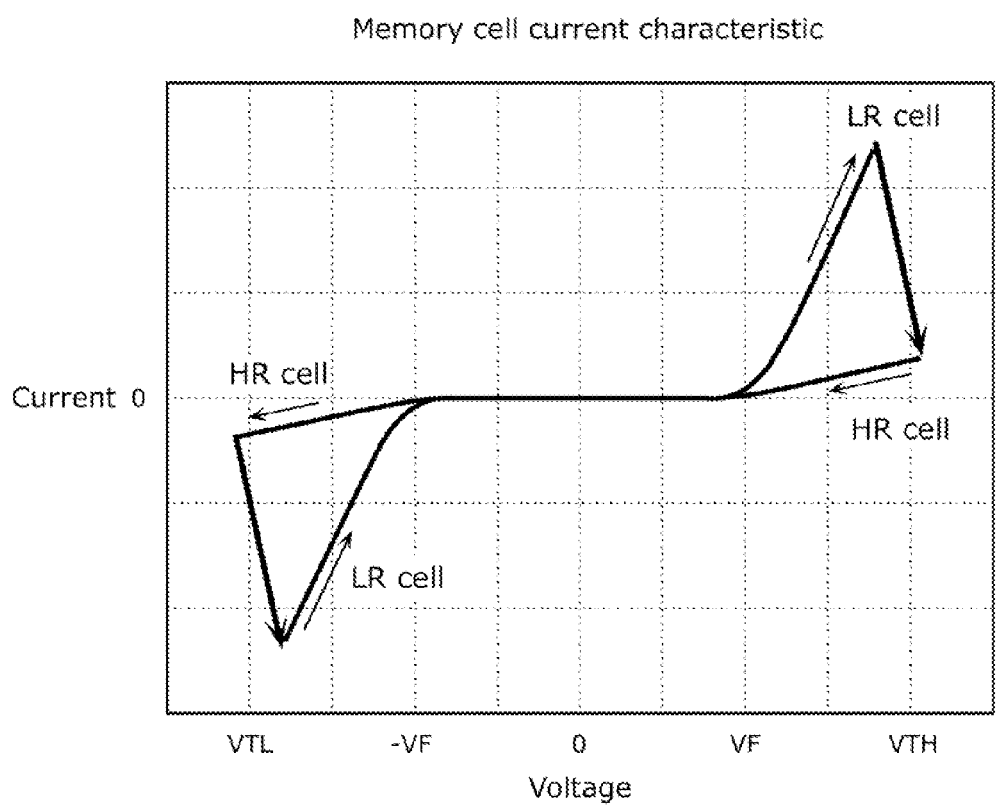
FIG. 5 is a graph showing a current-voltage relationship of a memory cell in the embodiment of the present invention.

FIG. 5 is a graph showing a current-voltage relationship of a memory cell in the present embodiment. The graph in FIG. 5 corresponds to the current-voltage characteristic of the memory cell in the circuit diagram of FIG. 1A. In FIG. 5, the horizontal axis represents a voltage applied between a bit line and a word line, and the vertical axis represents a current that flows through a memory cell. Further, an "LR cell" shown in FIG. 5 indicates that a memory cell (more strictly, the variable resistance element in the memory cell) is in the low resistance state, and an "HR cell" indicates that a memory cell (more strictly, the variable resistance element in the memory cell) is in the high resistance state. As shown in FIG. 5, now assuming that a memory cell is in the low resistance state (LR cell), when a voltage applied to the memory cell increases and exceeds VF, a current greatly increases. When the voltage further increases and becomes close to VTH, the resistance value of the memory cell changes rapidly, and the memory cell enters the high resistance state (HR cell), and a current greatly decreases. On the other hand, when a voltage applied to the memory cell is decreased and becomes lower than VTL, the resistance value of the memory cell changes rapidly, the memory cell enters the low resistance state (LR cell), and a current greatly increases. In this way, a resistance change occurs bidirectionally for the polarities of the applied voltage.

Figure 6:
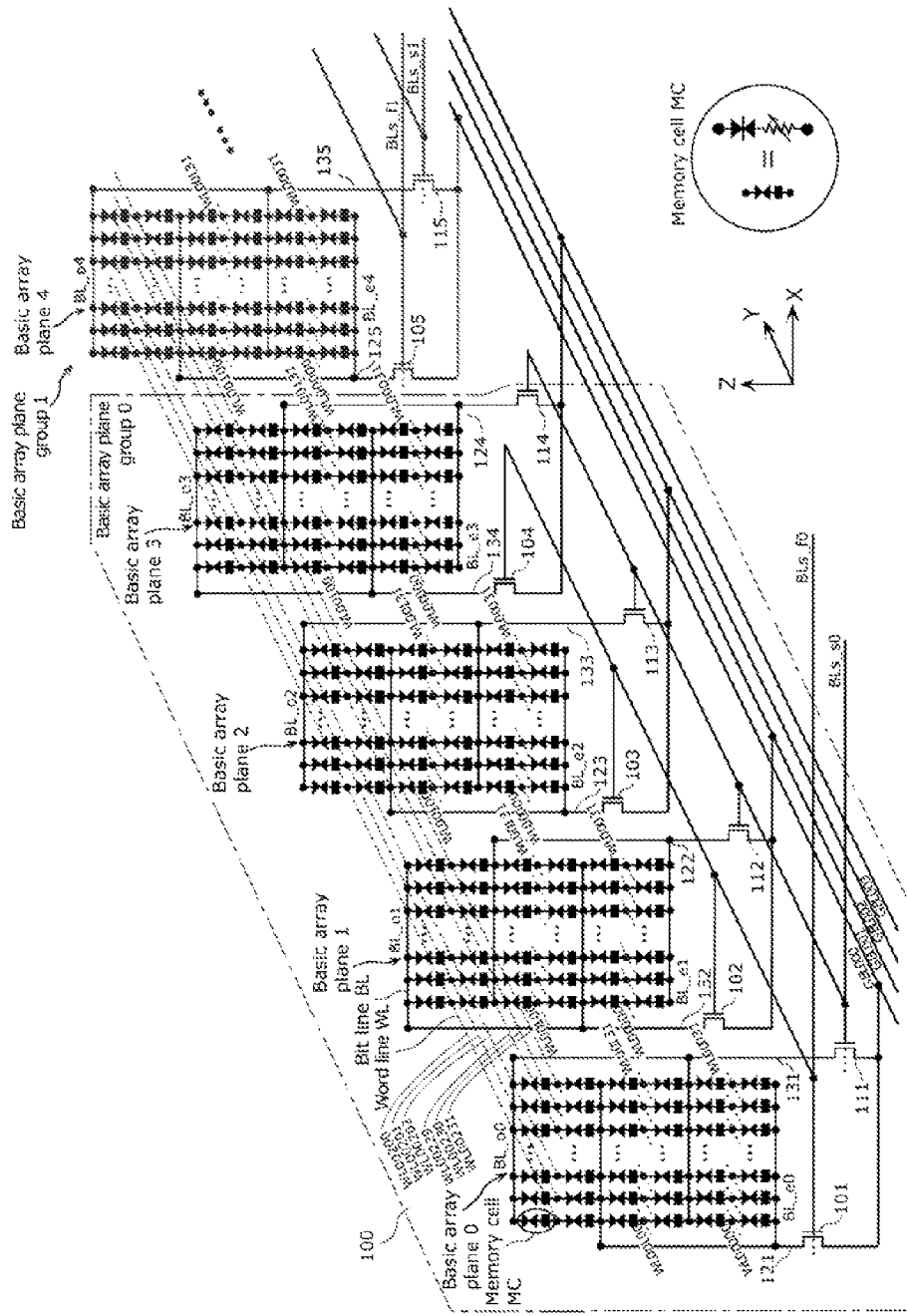
FIG. 6 is a circuit diagram showing an embodiment of a configuration of a basic array plane group according to the present invention.

FIG. 6 is a circuit diagram showing the configuration of a basic array plane group 100 in the variable resistance nonvolatile memory device according to the present embodiment. In FIG. 6, the X direction is a direction in which bit lines (sub-bit lines) extend, the Y direction is a direction in which word lines extend, and the Z direction is a direction in which layers of the bit lines and the word lines are stacked. In other words, the X direction and the Y direction are directions orthogonal to each other on a plane parallel to the main surface of a substrate (not shown) serving as a base above which memory cells are formed, and the Z direction is a direction in which layers are stacked above the main surface of the substrate.

In FIG. 6, when each layer is a layer in which bit lines that extend in the X direction are aligned in the Y direction, bit lines BL are formed in a plurality of layers (four layers in FIG. 6), whereas when each layer is a layer in which word lines that extend in the Y direction are aligned in the X direction, word lines WL are formed in layers (three layers in FIG. 6) between the bit lines. Then, in the basic array plane group 100, each memory cell MC is formed at a different one of three-dimensional crosspoints between the bit lines BL and the word lines WL, so as to be interposed between a corresponding one of the bit lines BL and a corresponding one of the word lines WL. It should be noted that some of the memory cells MC and some of the word lines are omitted in the drawing for the sake of simplification.

For each group of bit lines BL in layers aligned in the Z direction (i.e., at the same position in the Y direction), a corresponding one of basic array planes 0 to 3 is formed using memory cells MC that are formed between the bit lines BL and the word lines WL. The word lines WL are common in the basic array planes 0 to 3. In the example in FIG. 6, in each of the basic array planes 0 to 3, 32 memory cells MC are arranged in the X direction, and 6 memory cells MC are arranged in the Z direction. Further, the basic array plane group 100 includes the four basic array planes 0 to 3 aligned in the Y direction. Here, a basic array plane 4 included in another basic array plane group (basic array plane group 1) adjacent to the basic array plane group 100 (basic array plane group 0) is also shown in FIG. 6. It should be noted that the number of memory cells in each basic array plane and the number of basic array planes aligned in the Y direction are not limited to this example.

In the basic array planes 0 to 3, even-layer bit lines BL (BL_e0 to BL_e3) in the basic array planes are commonly connected via respective first via groups 121 to 124, whereas odd-layer bit lines BL (BL_o0 to BL_o3) are commonly connected via respective second via groups 131 to 134. It should be noted that as shown in FIG. 6, the "even-layer bit lines BL_e0" refer to bit lines in the second and fourth layers from the top layer among bit lines in four layers in the basic array plane 0, the "even-layer bit lines BL_e1" refer to bit lines in the second and fourth layers from the top layer among bit lines in four layers in the basic array plane 1, the "even-layer bit lines BL_e2" refer to bit lines in the second and fourth layers from the top layer among bit lines in four layers in the basic array plane 2, and the "even-layer bit lines BL_e3" refer to bit lines in the second and fourth layers from the top layer among bit lines in four layers in the basic array plane 3.

Also, the "odd-layer bit lines BL_o0" refer to bit lines in the first and third layers from the top layer among bit lines in four layers in the basic array plane 0, the "odd-layer bit lines BL_o1" refer to bit lines in the first and third layers from the top layer among bit lines in four layers in the basic array plane 1, the "odd-layer bit lines BL_o2" refer to bit lines in the first and third layers from the top layer among bit lines in four layers in the basic array plane 2, and the "odd-layer bit lines BL_o3" refer to bit lines in the first and third layers from the top layer among bit lines in four layers in the basic array plane 3.

Here, in the basic array planes 0 and 2, the first via groups 121 and 123 that commonly connect the even-layer bit lines BL (BL_e0 and BL_e2), respectively, are arranged on the left side in the basic array planes 0 and 2 when viewed in the Y direction, and the second via groups 131 and 133 that commonly connect the odd-layer bit lines BL (BL_o0 and BL_o2), respectively, are arranged on the right side in the basic array planes 0 and 2 when viewed in the Y direction. On the other hand, in the basic array planes 1 and 3, the first via groups 122 and 124 that commonly connect the even-layer bit lines BL (BL_e1 and BL_e3), respectively, are arranged on the right side in the basic array planes 1 and 3 when viewed in the Y direction, and the second via groups 132 and 134 that commonly connect the odd-layer bit lines BL (BL_o1 and BL_o3), respectively, are arranged on the left side in the basic array planes when viewed in the Y direction.

Furthermore, global bit lines GBL000 to GBL003 are formed to extend in the Y direction in one-to-one correspondence with the basic array planes 0 to 3. In addition, first selection switch elements 101 to 104 and second selection switch elements 111 to 114 are provided for the respective basic array planes 0 to 3. In FIG. 6, each of the first selection switch elements 101 to 104 and the second selection switch elements 111 to 114 includes an N-MOS transistor.

The gates of the first selection switch elements 101 to 104 are commonly connected, and the first selection switch elements 101 to 104 respectively control switching between electrical connection and disconnection of the global bit lines GBL000 to GBL003 related to (corresponding to) the basic array planes to/from the via groups 121, 132, 123, and 134 of the basic array planes, in accordance with a first bit line selection signal BLs_f0 supplied to the gates. The gates of the second selection switch elements 111 to 114 are commonly connected, and the second selection switch elements 111 to 114 respectively control switching between electrical connection and disconnection of the global bit lines GBL000 to GBL003 related to (corresponding to) the basic array planes to/from the via groups 131, 122, 133, and 124 of the basic array planes, in accordance with a second bit line selection signal BLs_s0 supplied to the gates.

This configuration, realizes the above-described multi-layer crosspoint structure of the variable resistance nonvolatile memory device in the present embodiment. In addition, a hierarchical bit line system using the bit lines BL and the global bit lines GBL is realized. Furthermore, in each of the basic array planes 0 to 3, the number of the selection switch elements for realizing the hierarchical bit line system can be reduced to two by commonly connecting the even-layer bit lines BL and the odd-layer bit lines BL in the basic array plane via the first and second via groups, respectively. Accordingly, the basic array plane group of a small array size can be realized, without increasing the layout area.

Further, with this configuration, in the basic array plane 0, the even-layer bit lines BL_e0 are connected to the first selection switch element 101 via the first via group 121, and the odd-layer bit lines BL_o0 are connected to the second selection switch element 111 via the second via group 131. In contrast, in the basic array plane 1 adjacent to the basic array plane 0 in the Y direction, the even-layer bit lines BL_e1 are connected to the second selection switch element 112 via the first via group 122, and the odd-layer bit lines BL_o1 are connected to the first selection switch element 102 via the second via group 132. Further, the gates of the first selection switch elements 101 to 104 in the basic array planes in the basic array plane group 100 are commonly connected, and electrical connection and disconnection are controlled by the first bit line selection signal BLs_f0 supplied to the gates. Similarly, the gates of the second selection switch elements 111 to 114 are commonly connected, and electrical connection and disconnection are controlled by the second bit line selection signal BLs_s0 supplied to the gates. Thus, when the first bit line selection signal BLs_f0 is selected, the first selection switch elements 101 to 104 will be in a connected state (turned ON). In the basic array plane 0, the even-layer bit lines BL_e0 are connected to the global bit line GBL000 via the first via group 121 and the first selection switch element 101, and the odd-layer bit lines BL_o0 are electrically disconnected from the global bit line GBL000, whereas in the basic array plane 1, the odd-layer bit lines BL_o1 are connected to the global bit line GBL001 via the second via group 132 and the first selection switch element 102, and the even-layer bit lines BL_e1 are electrically disconnected from the global bit line GBL001. The same as in the case of the basic array plane 0 applies to the basic array plane 2, and the same as in the case of the basic array plane 1 applies to the basic array plane 3.

Specifically, with this configuration, when the first bit line selection signal BLs_f0 for the basic array plane group 100 is selected, and even-layer bit lines in a certain basic array plane are connected to a corresponding global bit line, even-layer bit lines in two basic array planes adjacent to the basic array plane in the Y to direction are electrically disconnected from respective global bit lines. It should be noted that a similar relationship to the above also holds for odd-layer bit lines, and furthermore this relationship always holds for any position of a basic array plane.

Figure 7:
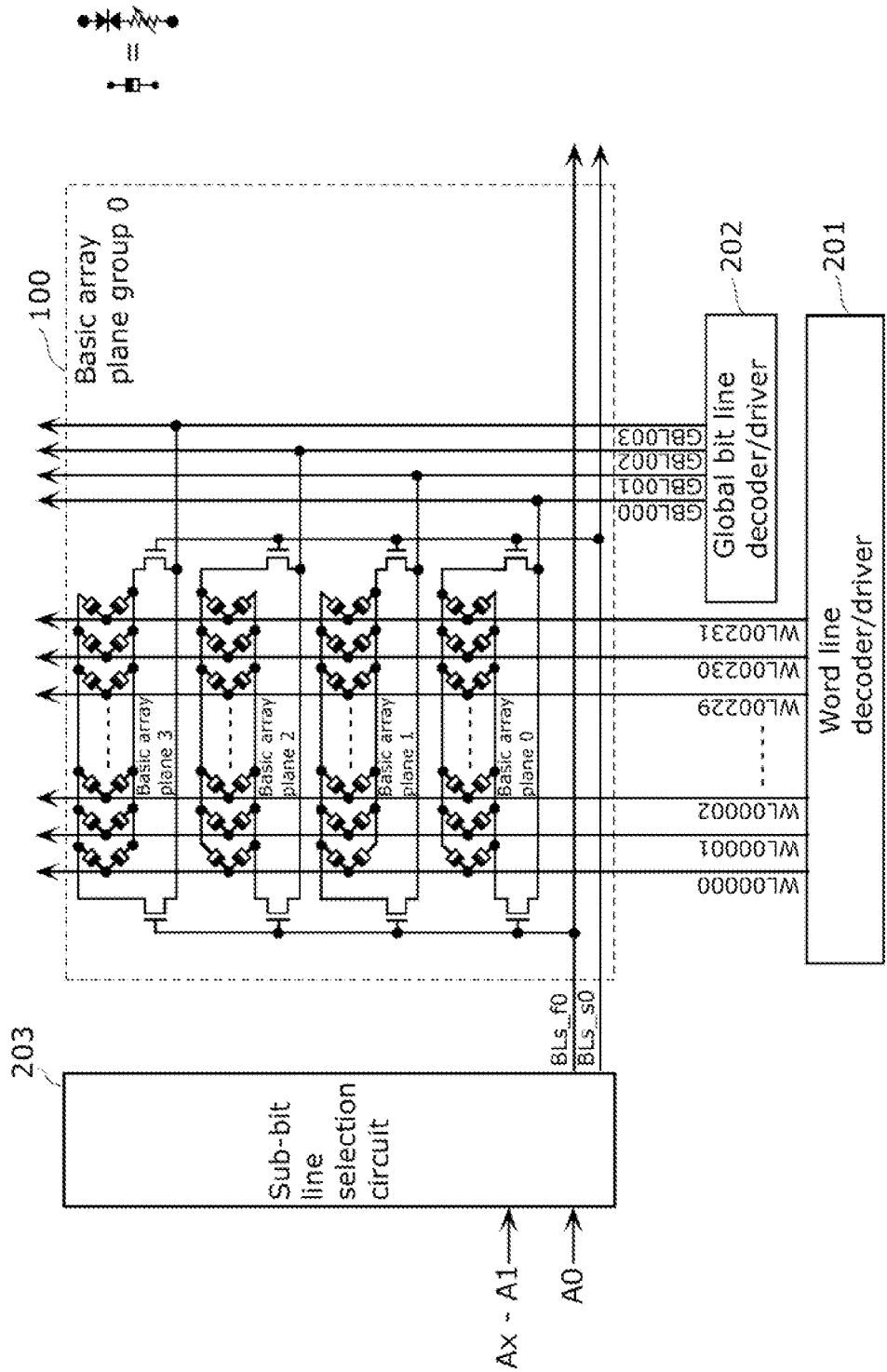
FIG. 7 is a circuit diagram showing the basic array plane group in FIG. 6 and its peripheral circuitry.

FIG. 7 is a circuit diagram showing the connecting relationship between the basic array plane group 100 in FIG. 6 and its peripheral circuitry. In FIG. 7, a global bit line decoder/driver 202 drives and controls the global bit lines GBL. Specifically, the global bit line decoder/driver 202 selects at least one of the global bit lines, and applies a read voltage to the at least one selected global bit line. A sub-bit line selection circuit 203 controls the first bit line selection signal BLs_f0 and the second bit line selection signal BLs_s0 according to address signals A0 to Ax. A word line decoder/driver 201 drives and controls the word lines WL.

Figure 8:
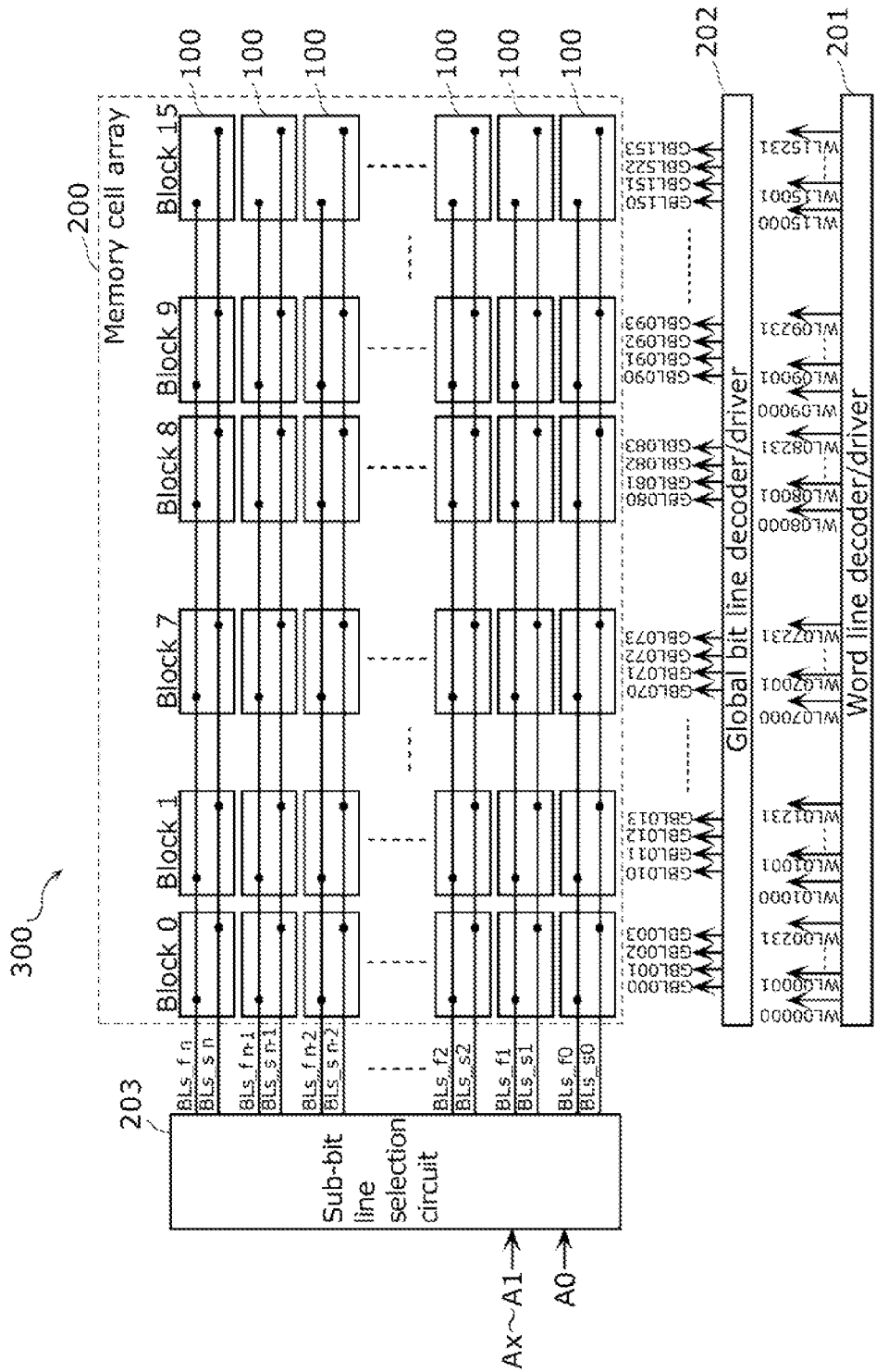
FIG. 8 is a circuit diagram showing a main part of a variable resistance nonvolatile memory device that uses the basic array plane groups in FIG. 6.

FIG. 8 is a circuit diagram showing a main part 300 of the variable resistance nonvolatile memory device. As shown in FIG. 8, in the actual apparatus, a memory cell array 200 is formed by arranging a plurality of the basic array plane groups 100 shown in FIG. 6. In the example of FIG. 8, [(n+1)×16] basic array plane groups 100 are arranged. The word line decoder/driver 201 drives and controls word lines WL, and the global bit line decoder/driver 202 drives and controls global bit lines GBL. The sub-bit line selection circuit 203 controls first control signals BLs_f0 to BLs_fn and second control signals BLs_s0 to BLs_sn for the respective basic array plane groups 100 according to the address signals A0 to Ax.

Figure 9:
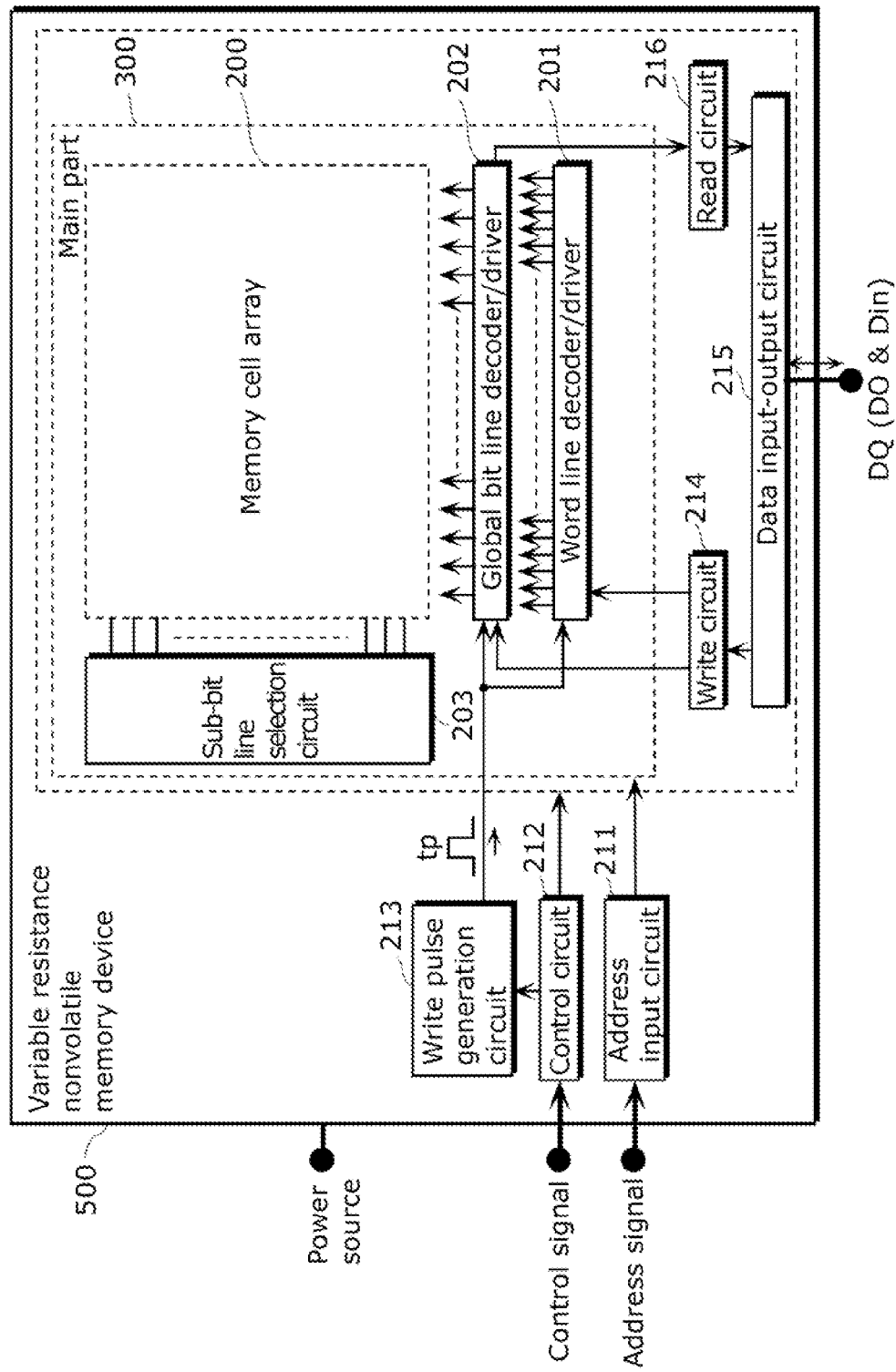
FIG. 9 is a circuit diagram showing an overall configuration of the variable resistance nonvolatile memory device according to the present invention.

FIG. 9 is a circuit diagram showing an overall configuration of a variable resistance nonvolatile memory device 500. In FIG. 9, the main part 300 corresponds to the configuration shown in FIG. 8.

In FIG. 9, an address input circuit 211 temporarily latches address signals from outside during an erase cycle (change to the high resistance state), a write cycle (change to the low resistance state), or a read cycle, and outputs the latched address signals to the sub-bit line selection circuit 203, the global bit line decoder/driver 202, and the word line decoder/driver 201. In response to a plurality of input signals, a control circuit 212 outputs a signal indicating a state in the erase cycle, the write cycle, the read cycle, or standby to the sub-bit line selection circuit 203, the global bit line decoder/driver 202, the word line decoder/driver 201, a write circuit 214, and a data input-output circuit 215, as a signal corresponding to each. Also, the control circuit 212 outputs an erase, write, or read pulse generating trigger signal in the erase, write, or read cycle to a write pulse generation circuit 213. The write pulse generation circuit 213 generates erase, write, or read time pulses in the erase, write, or read cycle during a given period (a period of tp_E, tp_W, or tp_R) and outputs the generated pulses to the global bit line decoder/driver 202 and the word line decoder/driver 201.

<Operation of Variable Resistance Nonvolatile Memory Device 500 According to Present Invention>

Figure 10:
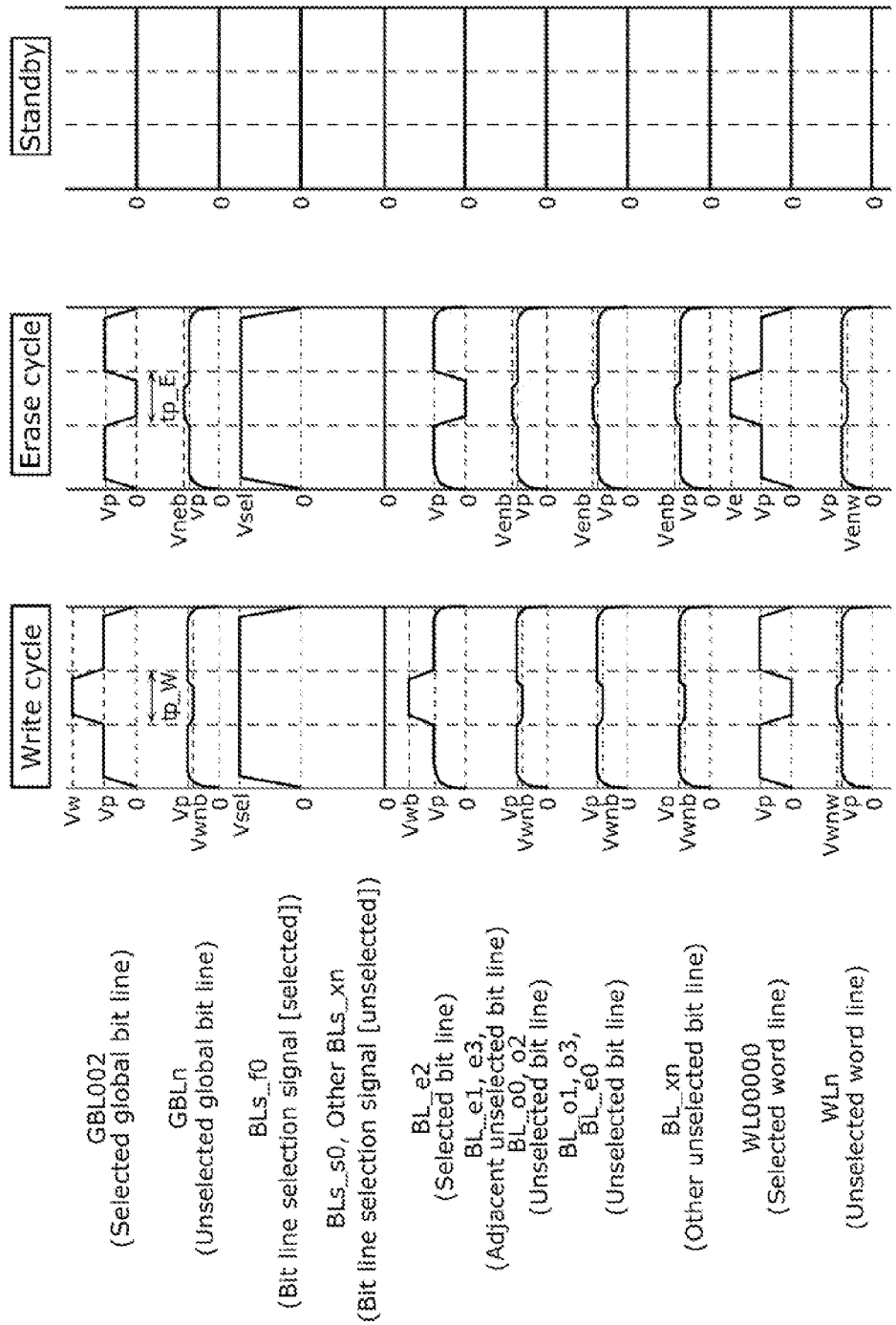
FIG. 10 is a timing waveform diagram for writing, erasing, and standby operations of the basic array plane group in FIG. 6.
Figure 11A:
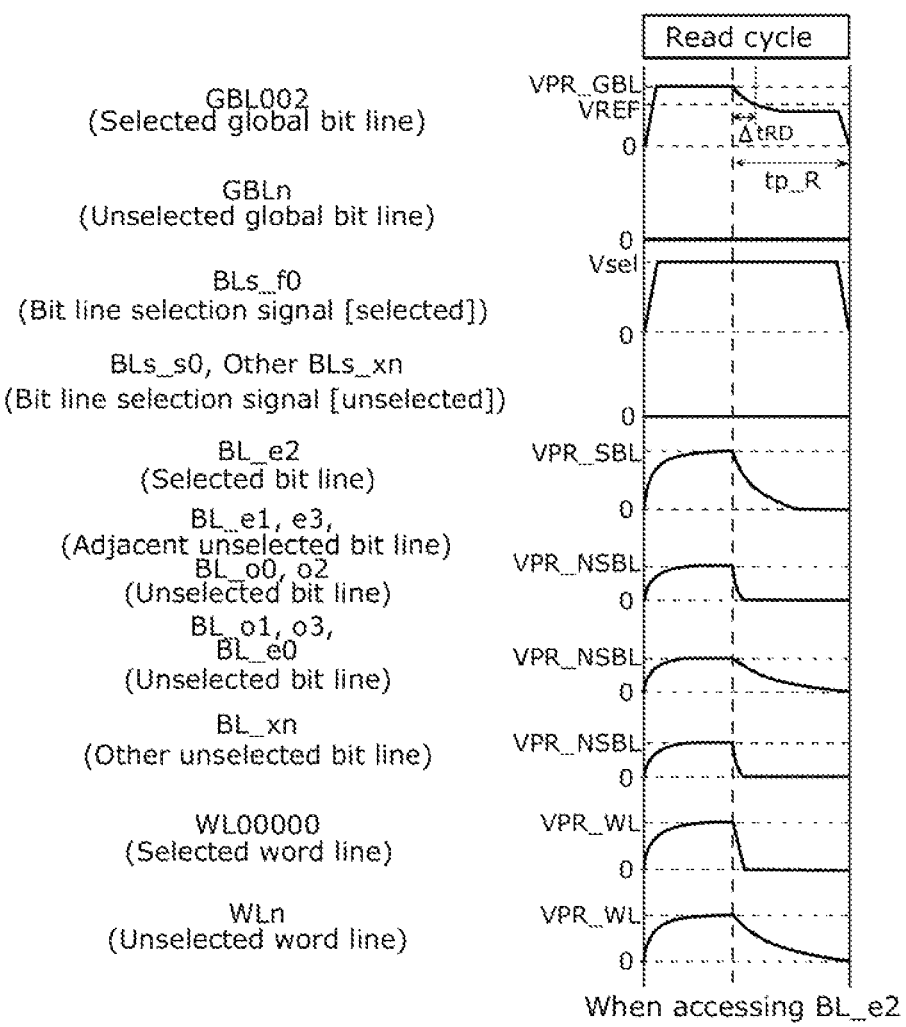
FIG. 11A is a timing waveform diagram for the reading operation of the basic array plane group in FIG. 6 (when accessing BL_e2).
Figure 11B:
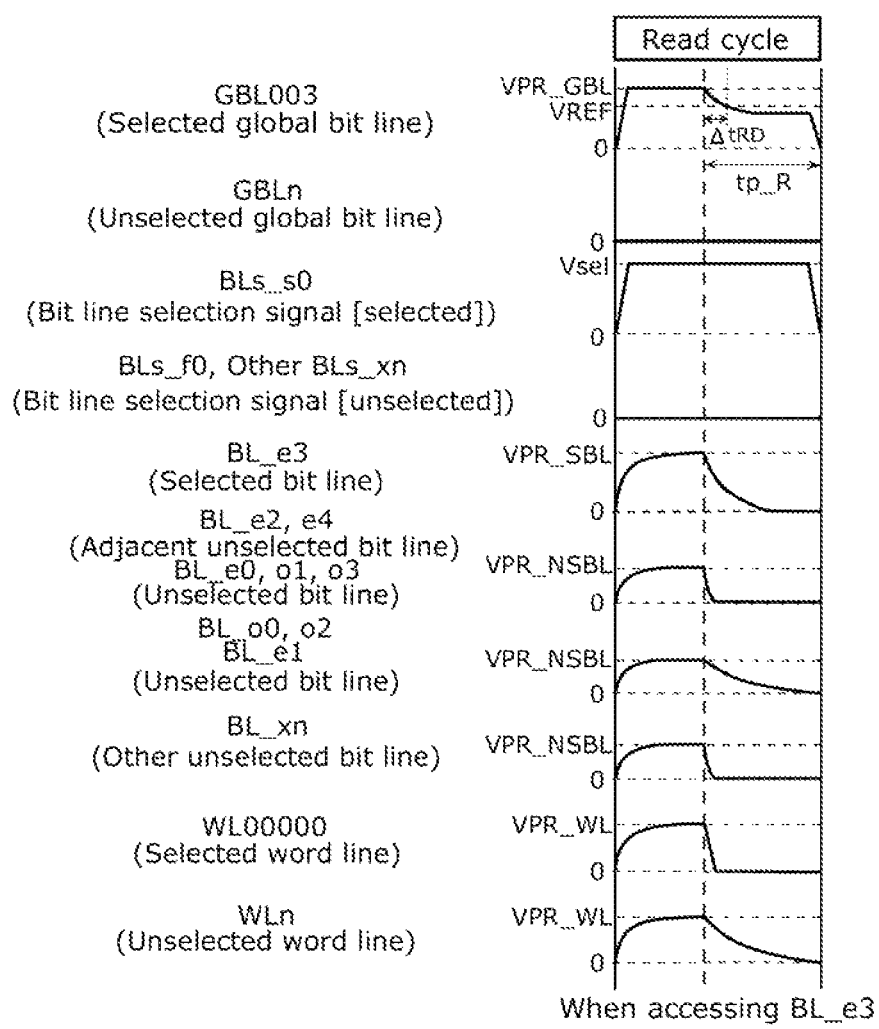
FIG. 11B is a timing waveform diagram for the reading operation of the basic array plane group in FIG. 6 (when accessing BL_e3).

FIGS. 10, 11A, and 11B are operation timing diagrams of the basic array plane group shown in FIG. 6. The memory operation is roughly divided into four, namely, the write cycle, the erase cycle, and standby which are shown in FIG. 10 and the read cycle shown in FIGS. 11A and 11B.

First is a description of the write cycle. FIG. 10 shows the case of writing a memory cell (changing its state to the low resistance state) connected to the word line WL00000 and a corresponding one of the bit lines BL_e2, as an example of the writing operation. In the write cycle, the variable resistance element of a selected memory cell changes its state from the high resistance state to the low resistance state or from the low resistance state to the high resistance state. First, a precharge voltage Vp is applied to a selected global bit line (GBL002 in FIG. 10) and a selected word line (WL00000 in FIG. 10). The precharge voltage is not applied to the other unselected global bit lines and the other unselected word lines. Further, a selection voltage Vsel is applied to a selected one of the first bit line selection signal BLs_f0 and the second bit line selection signal BLs_s0 (BLs_f0 in FIG. 10), and selected bit lines (BL_e2 in FIG. 10) are precharged to the precharge voltage Vp. Unselected global bit lines, unselected bit lines, and unselected word lines are precharged to the precharge voltage Vp by sneak current that leaked from the selected bit lines and the selected word line via memory cells.

Next, a writing voltage Vw is applied to the selected global bit line GBL002, thereby applying a writing voltage Vwb to the selected bit lines BL_e2. In addition, 0 V is applied to the selected word line WL00000, and the writing voltage Vwb is applied to the memory cell connected to the selected word line WL00000 and a corresponding one of the selected bit lines BL_e2, thereby writing the memory cell. At this time, the voltage of the unselected bit lines changes to a stable voltage Vwnb which is determined based on the voltage Vwb of the selected bit lines BL_e2 and a voltage of 0 V of the selected word line WL00000, and which is higher than 0 V and lower than Vwb, and the voltage of the unselected word lines changes to a stable voltage Vwnw which is higher than 0 V and lower than Vwb, as in the above case. Thus, only a voltage lower than the writing voltage Vwb is applied to unselected memory cells.

Next is a description of the erase cycle. FIG. 10 shows the case of easing a memory cell (changing its state to the high resistance state) connected to the word line WL00000 and a corresponding one of the bit lines BL_e2, as an example of the erase operation. Although basic operation in the erase cycle is the same as that in the write cycle, a difference is that a voltage Ve of reverse polarity to the precharge voltage Vp is applied to the selected memory cell. First, the precharge voltage Vp is applied to a selected global bit line (GBL002 in FIG. 10) and a selected word line (WL00000 in FIG. 10). The precharge voltage is not applied to the other unselected global bit lines and the other unselected word lines. Further, the selection voltage Vsel is applied to a selected one of the first bit line selection signal BLs_f0 and the second bit line selection signal BLs_s0 (BLs_f0 in FIG. 10), and selected bit lines (BL_e2 in FIG. 10) are precharged to the precharge voltage Vp. Unselected global bit lines, unselected bit lines, and unselected word lines are precharged to the precharge voltage Vp by a sneak current that leaked from the selected bit lines and the selected word line via memory cells.

Next, the erasing voltage Ve is applied to the selected word line WL00000. In addition, 0 V is applied to the selected bit lines BL_e2, and the erasing voltage Ve is applied to the memory cell connected to the selected word line WL00000 and a corresponding one of the selected bit lines BL_e2, thereby erasing the memory cell. At this time, the voltage of the unselected bit lines changes to a stable voltage Venb which is determined based on the voltage Ve of the selected word line WL00000, and a voltage of 0 V of the selected bit lines BL_e2, and which is higher than 0 V and lower than Ve, and the voltage of the unselected word lines changes to a stable voltage Venw which is higher than 0 V and lower than Ve, as in the above case. Thus, only a voltage lower than the erasing voltage Ve is applied to unselected memory cells.

Next is a description of the read cycle. FIG. 11A shows the case of reading a memory cell connected to the word line WL00000 and a corresponding one of the bit lines BL_e2, as an example of the reading operation. In the read cycle, first, a precharge voltage VPR_GBL is applied to a selected global bit line (GBL002 in FIG. 11A). A voltage may be applied or may not be applied to the other unselected global bit lines. Further, the selection voltage Vsel is applied to a selected one of the first bit line selection signal BLs_f0 and the second bit line selection signal BLs_s0 (BLs_f0 in FIG. 11A), and an unselection voltage (0 V in FIG. 11A) is applied to the other unselected bit line selection signal. A voltage is not applied to the selected word line (WL00000 in FIG. 11A) and unselected word lines. As a result of the above voltage application, the selected bit lines (BL_e2 in FIG. 11A) are precharged to a precharge voltage VPR_SBL via the global bit line GBL002, the selected word line WL00000 and unselected word lines are precharged to VPR_WL from the selected bit lines BL_e2 via a memory cell, and unselected bit lines are precharged to VPR_NSBL from selected and unselected word lines via memory cells.

It should be noted that although a voltage may be applied to unselected global bit lines in the above, in that case, a voltage to be applied is lower than the precharge voltage VPR_GBL applied to the selected global bit line GBL002, and closer to the precharge voltage VPR_NSBL applied to the unselected bit lines, thereby enabling reduction of a leak voltage between unselected global bit lines and unselected bit lines via bit line selection switches. Further, influence on the selected global bit line GBL002 can be prevented from being exerted via interline capacitance by applying and fixing a voltage to unselected global bit lines.

Next, the application of a voltage to the selected global bit line GBL002 is stopped, and the voltage of the selected word line WL00000 is changed from VPR_WL to 0 V. A voltage is not applied to the other unselected word lines. Accordingly, a read voltage VPR_SBL is applied to the selected memory cell, and the electric charge stored in the selected bit lines BL_e2 and the selected global bit line GBL002 is discharged according to the resistance value of the variable resistance element of the memory cell. A read circuit 216 in FIG. 9 detects a time ΔtRD until when the potential of the selected global bit line GBL002 reaches a determination voltage VREF, thereby determining whether a memory cell is in the low resistance state or the high resistance state.

Here, the voltage of the selected word line WL00000 has changed from VPR_WL to 0 V, and thus the voltages of unselected bit lines and unselected word lines respectively change from VPR_NSBL and VPR_WL to the stable voltages determined based on the voltages of the selected bit lines BL_e2 and the selected word line WL00000.

At this time, although unselected bit lines adjacent to the selected bit lines BL_e2 in the same layers (i.e., in the Y direction) are the bit lines BL_e1 and BL_e3, both the unselected bit lines BL_e1 and BL_e3 are disconnected from the global bit lines by the second bit line selection signal BLs_s0 (since the second selection switch elements 112 and 114 are in the disconnected state). Thus, the load capacitance of the lines is small, and the voltage thereof quickly changes to the stable voltage. Changes in signals in both the adjacent unselected bit lines BL_e1 and BL_e3 propagate to the selected bit lines via interline capacitance between the selected bit lines BL_e2 and the adjacent unselected bit lines BL_e1 and between the selected bit lines BL_e2 and the adjacent unselected bit lines BL_e3, and thus a signal in the selected bit lines changes more quickly, compared to when signals in adjacent unselected bit lines do not change.

FIG. 11B shows the case of reading a memory cell connected to the word line WL00000 and a corresponding one of the bit lines BL_e3, as another example of the reading operation. It is assumed that the resistance value of a variable resistance element is the same as that of the memory cell connected to the word line WL00000 and a corresponding one of the bit lines BL_e2. In the read cycle, first, a precharge voltage VPR_GBL is applied to a selected global bit line (GBL003 in FIG. 11B). A voltage may be applied or may not be applied to the other unselected global bit lines, as in the above description. Further, a selection voltage Vsel is applied to a selected one of the first bit line selection signal BLs_f0 and the second bit line selection signal BLs_s0 (BLs_s0 in FIG. 11B), and an unselection voltage (0 V in FIG. 11B) is applied to the other unselected bit line selection signal. A voltage is not applied to a selected word line (WL00000 in FIG. 11B) and unselected word lines. As a result of the above voltage application, the selected bit lines (BL_e3 in FIG. 11B) are precharged to the precharge voltage VPR_SBL via the global bit line GBL003, the selected word line WL00000 and unselected word lines are precharged to VPR_WL from the selected bit lines BL_e3 via a memory cell, and unselected bit lines are precharged to VPR_NSBL from selected and unselected word lines via memory cells.

Next, the application of a voltage to the selected global bit line GBL003 is stopped, and the voltage of the selected word line WL00000 is changed from VPR_WL to 0 V. A voltage is not applied to the other unselected word lines. Accordingly, the read voltage VPR_SBL is applied to the selected memory cell, the electric charge stored in the selected bit lines BL_e3 and the selected global bit line GBL003 is discharged via the memory cell. The read circuit 216 in FIG. 9 detects a time ΔtRD until when the potential of the selected global bit line GBL003 reaches the determination voltage VREF, thereby determining whether the memory cell is in the low resistance state or the high resistance state.

Here, the voltage of the selected word line WL00000 has changed from VPR_WL to 0 V, and thus the voltages of unselected bit lines and unselected word lines respectively change from VPR_NSBL and VPR_WL to the stable voltages determined based on the voltages of the selected bit lines BL_e3 and the selected word line WL00000.

At this time, although unselected bit lines adjacent to the selected bit lines BL_e3 in the same layers (i.e., in the Y direction) are the bit lines BL_e2 and BL_e4, both the unselected bit lines BL_e2 and BL_e4 are disconnected from the global bit lines by the bit line selection signals BLs_f0 and BLs_f1, respectively (since the first selection switch elements 103 and 105 are in the disconnected state), and thus the load capacitance of the lines is small, and the voltage thereof quickly changes to the stable voltage. Changes in the signals in the adjacent unselected bit lines BL_e2 and BL_e4 propagate to the selected bit lines via the interline capacitance between the selected bit lines BL_e3 and the adjacent unselected bit lines BL_e2 and between the selected bit lines BL_e3 and the adjacent unselected bit lines BL_e4, and thus a signal in the selected bit lines changes more quickly, compared to when signals in adjacent unselected bit lines do not change.

However, the speed at which signals in the adjacent unselected bit lines BL_e2 and BL_e4 change is substantially the same as the speed at which signals in the adjacent unselected bit lines BL_e1 and BL_e3 change in the case of reading the memory cell connected to the selected word line WL00000 and a corresponding one of the bit lines BL_e2, and also the influence is substantially the same which is exerted on a change in a signal in the selected bit lines BL_e3 via the interline capacitance between the selected bit lines BL_e3 and the adjacent unselected bit lines BL_e2 and between the selected bit lines BL_e3 and the adjacent unselected bit lines BL_e4. Therefore, when the resistance value of the variable resistance element of a selected memory cell is the same, the time ΔtRD until when the potential of a global bit line reaches the determination voltage VREF has substantially the same value as that in the case of reading the memory cell connected to the selected word line WL00000 and a to corresponding one of the unselected bit lines BL_e2.

Figure 23:
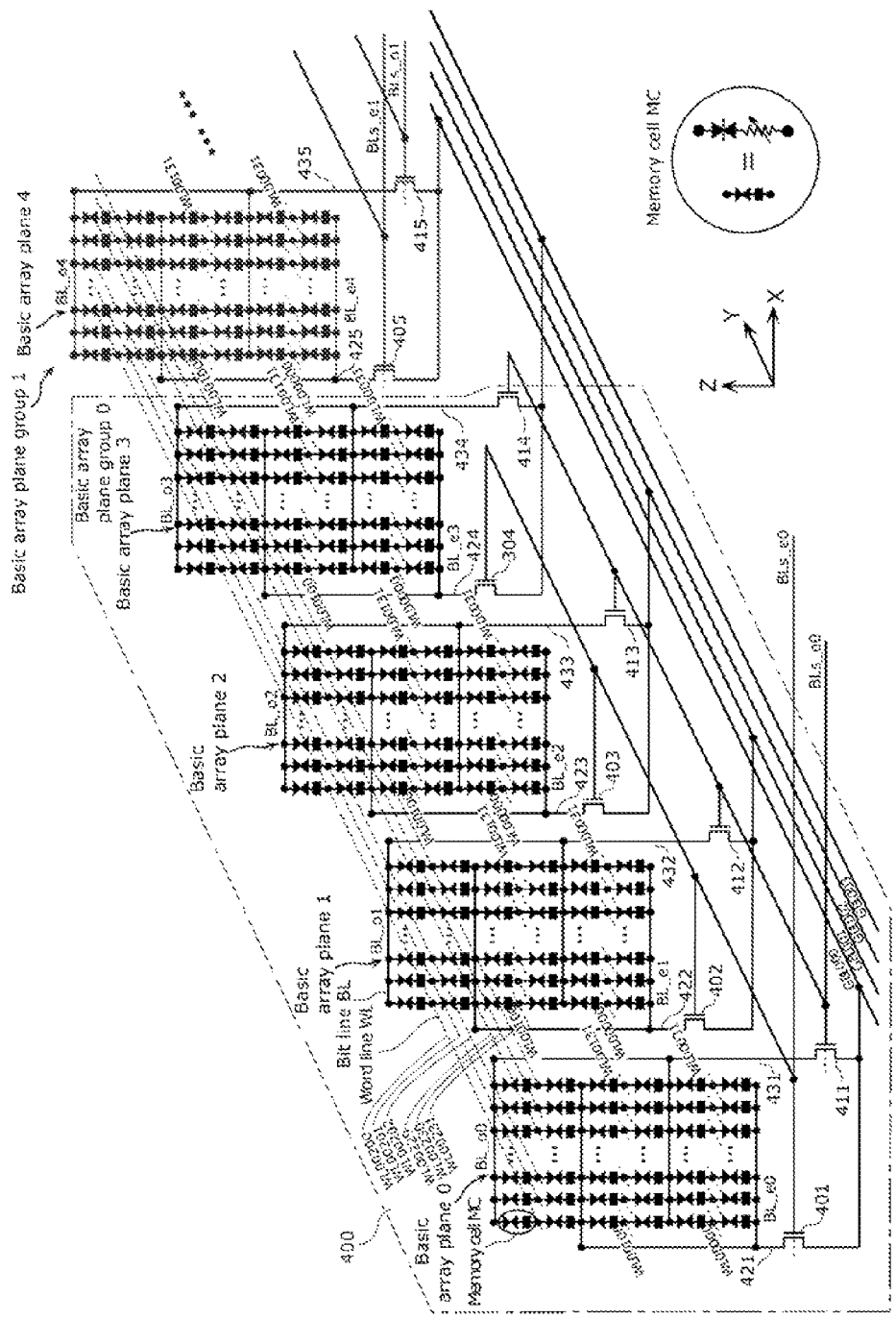
FIG. 23 is a circuit diagram showing a configuration of a conventional basic array plane group.

Now, consider the case of PTL 6 using a memory cell array according to a conventional example, or specifically, a configuration shown in FIG. 23.

Figure 24A:
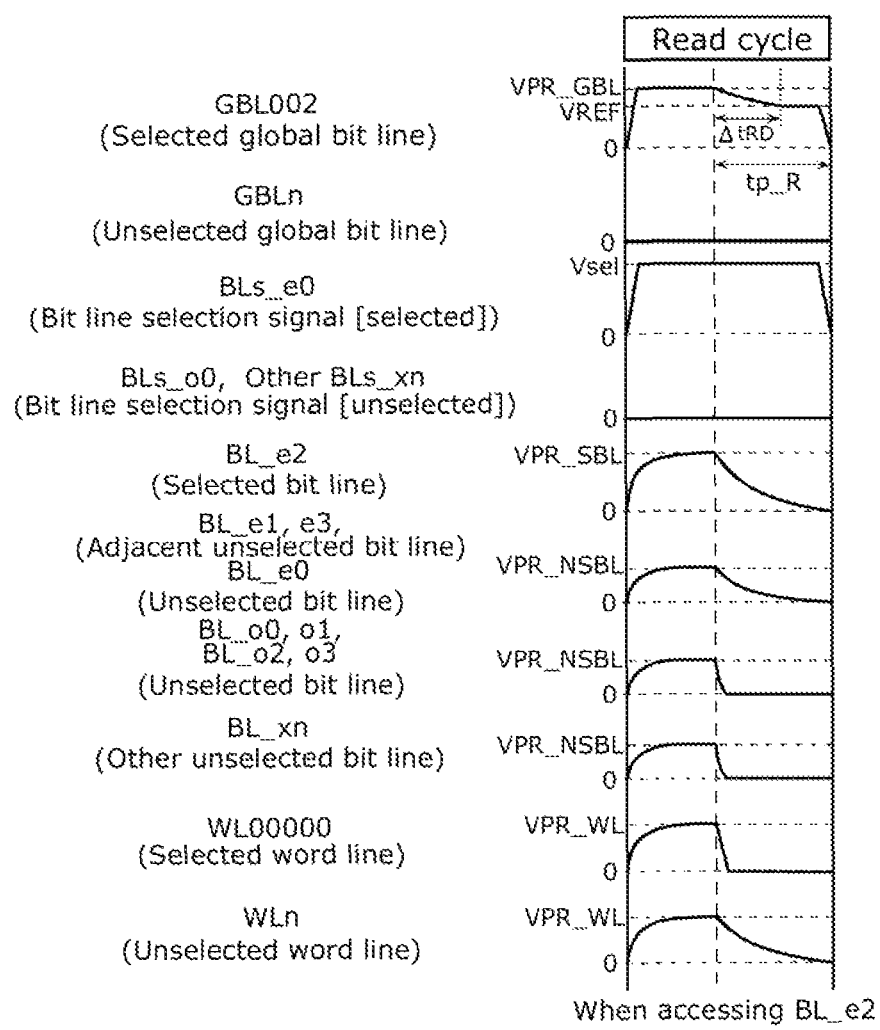
FIG. 24A is a timing waveform diagram for the reading operation of the basic array plane group in FIG. 23 (when accessing BL_e2).

FIG. 24A shows the case of reading a memory cell connected to the word line WL00000 and a corresponding one of the bit lines BL_e2, as an example of the reading operation. In the read cycle, first, the precharge voltage VPR_GBL is applied to a selected global bit line (GBL002 in FIG. 24A). A voltage may be applied or may not be applied to the other unselected global bit lines. Further, a selection voltage Vsel is applied to a selected one of an even-layer selection signal BLs_e0 and an odd-layer selection signal BLs_o0 (BLs_e0 in FIG. 24A), and an unselection voltage (0 V in FIG. 24A) is applied to the other unselected layer selection signal. A voltage is not applied to a selected word line (WL00000 in FIG. 24A) and unselected word lines. As a result of the above voltage application, the selected bit lines (BL_e2 in FIG. 24A) are precharged to the precharge voltage VPR_SBL via the global bit line GBL002, the selected word line WL00000 and the unselected word lines are precharged to VPR_WL from the selected bit lines BL_e2 via a memory cell, and unselected bit lines are precharged to VPR_NSBL from selected and unselected word lines via memory cells.

Next, the application of a voltage to the selected global bit line GBL002 is stopped, and the voltage of the selected word line WL00000 is changed from VPR_WL to 0 V. A voltage is not applied to the other unselected word lines. Accordingly, the read voltage VPR_SBL is applied to the selected memory cell, and according to the resistance value of the variable resistance element of the memory cell, the electric charge stored in the selected bit lines BL_e2 and the selected global bit line GBL002 is discharged. The read circuit 216 in FIG. 9 detects a time ΔtRD until when the potential of the selected global bit line GBL002 reaches the determination voltage VREF, thereby determining whether the memory cell is in the low resistance state or the high resistance state.

Here, the voltage of the selected word line WL00000 has changed from VPR_WL to 0 V, and thus the voltages of the unselected bit lines and the unselected word lines respectively change from VPR_NSBL and VPR_WL to stable voltages determined based on the voltages of the selected bit lines BL_e2 and the selected word line WL00000.

At this time, as shown in FIG. 23, unselected bit lines adjacent to the selected bit lines BL_e2 in the same layers (i.e., in the Y direction) are the bit lines BL_e1 and BL_e3. Although both the unselected bit lines BL_e1 and BL_e3 are respectively connected to the global bit lines GBL001 and GBL003 by the even-layer selection signal BLs_e0, the load capacitance of the global bit lines is larger, and thus signals in both the unselected bit lines BL_e1 and BL_e3 change toward the stable voltage at a lower speed. Although both changes in the voltages of the adjacent unselected bit lines BL_e1 and BL_e3 propagate to the selected bit lines BL_e2 via the interline capacitance between the selected bit lines BL_e2 and the adjacent unselected bit lines BL_e1 and between the selected bit lines BL_e2 and the adjacent unselected bit lines BL_e3, the change in both of the signals in the adjacent unselected bit lines BL_e1 and BL_e3 is slow, and thus a signal in the selected bit lines BL_e2 changes at a lower speed, compared with the case of FIG. 11A.

Figure 24B:
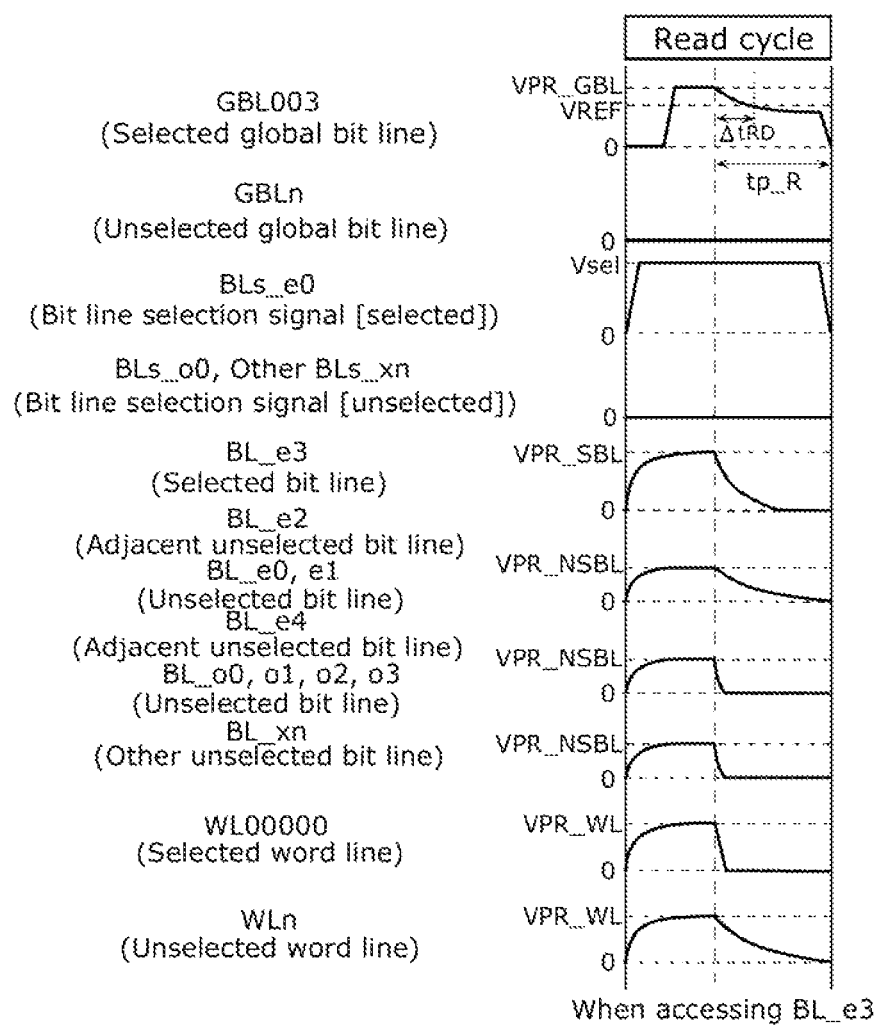
FIG. 24B is a timing waveform diagram for the reading operation of the basic array plane group in FIG. 23 (when accessing BL_e3).

Further, FIG. 24B shows the case of reading a memory cell connected to the word line WL00000 and a corresponding one of the bit lines BL_e3 as another example of the reading operation, when a memory cell array has a configuration according to a conventional example. It is assumed that the resistance value of the variable resistance element is the same as that of the memory cell connected to the word line WL00000 and a corresponding one of the bit lines BL_e2 described above. In the read cycle, first, the precharge voltage VPR_GBL is applied to a selected global bit line (GBL003 in FIG. 24B). A voltage may be applied or may not be applied to the other unselected global bit lines. Further, the selection voltage Vsel is applied to a selected one of the even-layer selection signal BLs_e0 and the odd-layer selection signal BLs_o0 (BLs_e0 in FIG. 24B), and an unselection voltage (0 V in FIG. 24B) is applied to the other unselected layer selection signal. A voltage is not applied to a selected word line (WL00000 in FIG. 24B) and unselected word lines. As a result of the above voltage application, the selected bit lines (BL_e3 in FIG. 24B) are precharged to the precharge voltage VPR_SBL via the global bit line GBL003, the selected word line WL00000 and unselected word lines are precharged to VPR_WL from the selected bit lines BL_e3 via a memory cell, and unselected bit lines are precharged to VPR_NSBL from the selected and unselected word lines via memory cells.

After the end of the precharging, the application of a voltage to the selected global bit line GBL003 is stopped, thereby changing the voltage of the selected word line WL00000 from VPR_WL to 0 V. A voltage is not applied to the other unselected word lines. Accordingly, the read voltage VPR_SBL is applied to the selected memory cell, and the electric charge stored in the selected bit lines BL_e3 and the selected global bit line GBL003 is discharged via the memory cell. The read circuit 216 in FIG. 9 detects a time ΔtRD until when the potential of the selected global bit line GBL003 reaches the determination voltage VREF, thereby determining whether the memory cell is in the low resistance state or the high resistance state.

Here, the voltage of the selected word line WL00000 has changed from VPR_WL to 0 V, and thus the voltages of the unselected bit lines and the unselected word lines respectively change from VPR_NSBL and VPR_WL to stable voltages determined based on the voltages of the selected bit lines BL_e3 and the selected word line WL00000.

At this time, as shown in FIG. 23, unselected bit lines adjacent to the selected bit lines BL_e3 in the same layers (i.e., in the Y direction) are the bit lines BL_e2 and BL_e4.

The unselected bit lines BL_e2 are connected to a global bit line by the layer selection signal BLs_e0, and the load capacitance of the lines is larger. Thus, a signal in the unselected bit lines BL_e2 changes toward the stable voltage at a lower speed. In contrast, the unselected bit lines BL_e4 are disconnected from a global bit line by the layer selection signal BLs_e1 (since the even-layer selection switch element 405 is in the disconnected state), the load capacitance of the lines is smaller, and thus a signal in the unselected bit lines BL_e4 changes toward the stable voltage at a higher speed. Although a change in the signals in the adjacent unselected bit lines propagates to the selected bit lines via the interline capacitance between the selected bit lines and the adjacent unselected bit lines, a signal in the adjacent unselected bit lines BL_e2 on one side changes at a higher speed, whereas a signal in the adjacent unselected bit lines BL_e4 on the other side changes at a lower speed, and thus the signal in the selected bit lines BL_e3 changes at a higher speed than the case of FIG. 24A and at a lower speed than the cases of FIGS. 11A and 11B.

Specifically, the signal in the adjacent unselected bit lines BL_e2 changes at a lower speed, and the signal in the adjacent unselected bit lines BL_e4 changes at a higher speed. However, as described above, signals in both the adjacent unselected bit lines BL_e1 and BL_e3 change at a lower speed in the case of reading the memory cell connected to the word line WL00000 and a corresponding one of the bit lines BL_e2. Therefore, even if the resistance value of a variable resistance element of a selected memory cell is the same, a time ΔtRD until when the potential of a global bit line reaches the determination voltage VREF is shorter than that in the case of reading the memory cell connected to the word line WL00000 and a corresponding one of the bit lines BL_e2, which causes variations in the determination time.

As described above, when a memory cell array has a configuration according to a conventional example, even if the resistance value of the variable resistance elements of memory cells is the same, a read time varies depending on the position of the memory cell to be read. However, a memory cell array having a configuration according to the present embodiment has a feature that a read time does not vary, irrespective of the position of a memory cell to be read.

(Simultaneous Reading From Basic Array Planes that are Not Adjacent to Each Other)

The above is a description of the case of reading only one memory cell from one basic array plane in the basic array plane group 100 in the read cycle. Specifically, although a description has been given on the case in which only one global bit line is selected, and reading operation is performed, the circuit configuration of the basic array plane group shown in FIG. 6 includes global bit lines corresponding to, in number, the basic array planes included in the basic array plane group. The word lines are common in the basic array plane group, and thus in the read cycle, it is possible to simultaneously read memory cells connected to the same word line in a plurality of basic array planes by simultaneously selecting these global bit lines.

However, in the case of simultaneously selecting memory cells in a plurality of given basic array planes in the basic array plane group, there are three possible cases, namely, the case in which bit lines adjacent to a selected bit line on both sides in the Y direction are both unselected bit lines, the case in which one of such bit lines is a selected bit line, and the other is an unselected bit line, and the case in which both of such bit lines are selected bit lines. Accordingly, as with the case of the conventional circuit configuration described with reference to FIGS. 23, 24A, and 24B, the behavior of a signal in an adjacent line in the Y direction is different, depending on the position of a memory cell (bit line) to be selected, and thus a read speed varies, which is a problem.

This problem can be solved by simultaneously reading, when a bit in a certain basic array plane is to be read, a bit in a basic array plane that is not adjacent to the certain basic array plane on both sides in the Y direction. For example, in the case of the circuit configuration in FIG. 6, it is sufficient for the global bit line decoder/driver 202 to, under the control of the control circuit 212, simultaneously select a memory cell in the basic array plane 2 when selecting a memory cell in the basic array plane 0, and simultaneously select a memory cell in the basic array plane 3 when selecting a memory cell in the basic array plane 1.

Figure 12:
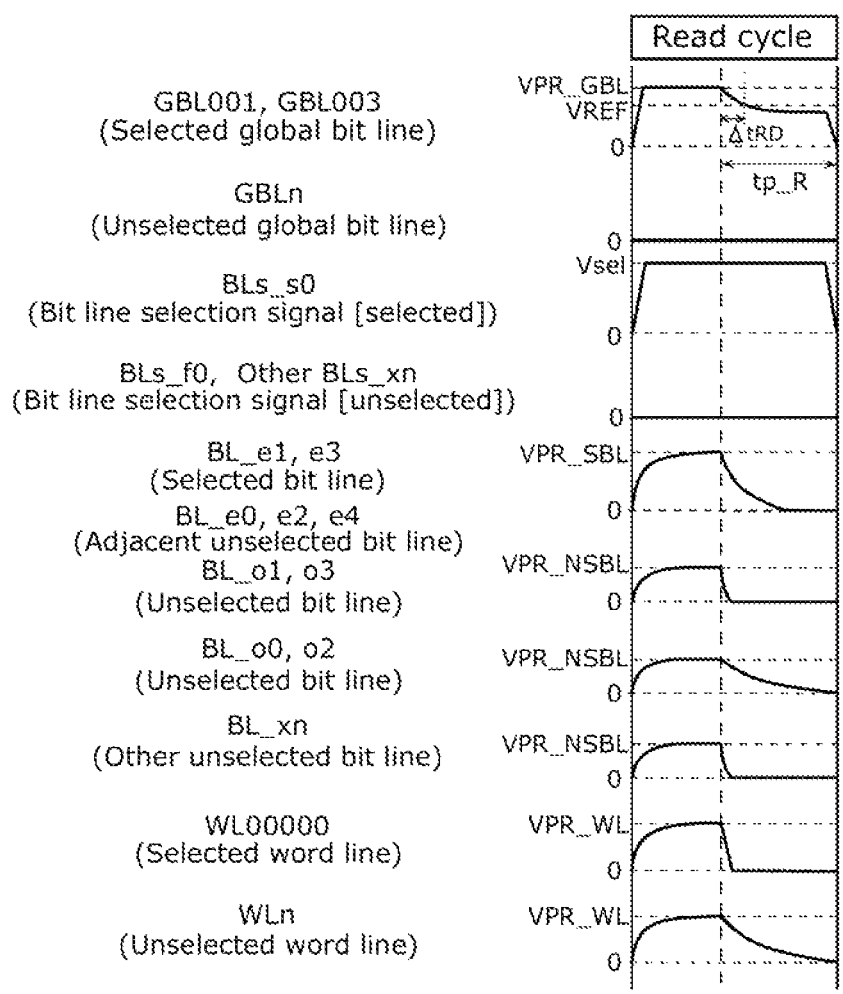
FIG. 12 is a timing waveform diagram for the reading operation of the basic array plane group in FIG. 6.

FIG. 12 shows the case of simultaneously reading a memory cell connected to the selected word line WL00000 and a corresponding one of the selected bit lines BL_e1, and a memory cell connected to the selected word line WL00000 and a corresponding one of the selected bit lines BL_e3, as an example of the simultaneous reading operation in the circuit configuration of FIG. 6. Although an overview of the operation is the same as in the case of FIG. 11B, a difference is that the global bit line decoder/driver 202 can simultaneously select the global bit line GBL001 in addition to the global bit line GBL003. At this time, although unselected bit lines adjacent in the Y direction to BL_e1 which is one of the sets of the selected bit lines are bit lines BL_e0 and BL_e2, both the unselected bit lines BL_e0 and BL_e2 are disconnected from the global bit lines by the bit line selection signal BL_f0 (since the first selection switch elements 101 and 103 are in the disconnected state). In contrast, unselected bit lines adjacent in the Y direction to BL_e3 which is another set of the selected bit lines are the bit lines BL_e2 and BL_e4, and also the unselected bit lines BL_e2 and BL_e4 are disconnected from the global bit lines by the bit line selection signals BL_f0 and BL_f1, respectively (since the first selection switch elements 103 and 105 are in the disconnected state). Therefore, unselected bit lines adjacent to both the selected bit lines BL_e1 and BL_e3 in the Y direction are disconnected from the global bit lines, and thus as in the case of FIGS. 11A and 11B, if the resistance value of variable resistance elements of the selected memory cells is the same, a time ΔtRD until when the potential of the global bit lines reaches the determination voltage VREF has a substantially same value for both the global bit lines.

It should be noted that when a memory cell connected to the word line WL00000 and a corresponding one of the bit lines BL_e0 and a memory cell connected to the word line WL00000 and a corresponding one of the bit lines BL_e2 are simultaneously read, and when a memory cell connected to the word line WL00000 and a corresponding one of the bit lines BL_e0 and a memory cell connected to the word line WL00000 and a corresponding one of the bit lines BL_e3 are simultaneously read, all unselected bit lines adjacent to the selected bit lines in the Y direction are disconnected from the global bit lines, similarly. Thus, in the above three cases, if the resistance value of variable resistance elements of selected memory cells is the same, the time ΔtRD until when the potential of the global bit lines reaches the determination voltage VREF has substantially the same value for the three cases.

<Physical Structure (Layout) of Basic Array Plane Group>

Figure 13:
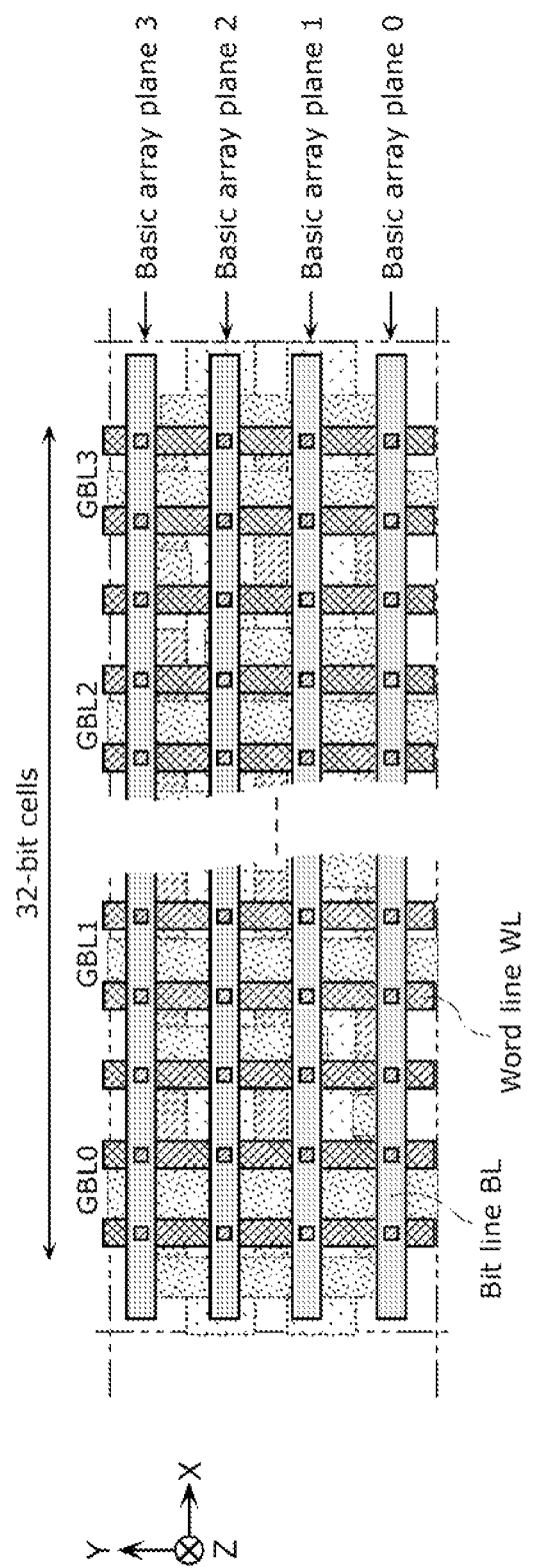
FIG. 13 is a plan view showing a physical structure of the basic array plane group according to the present invention.
Figure 14A:
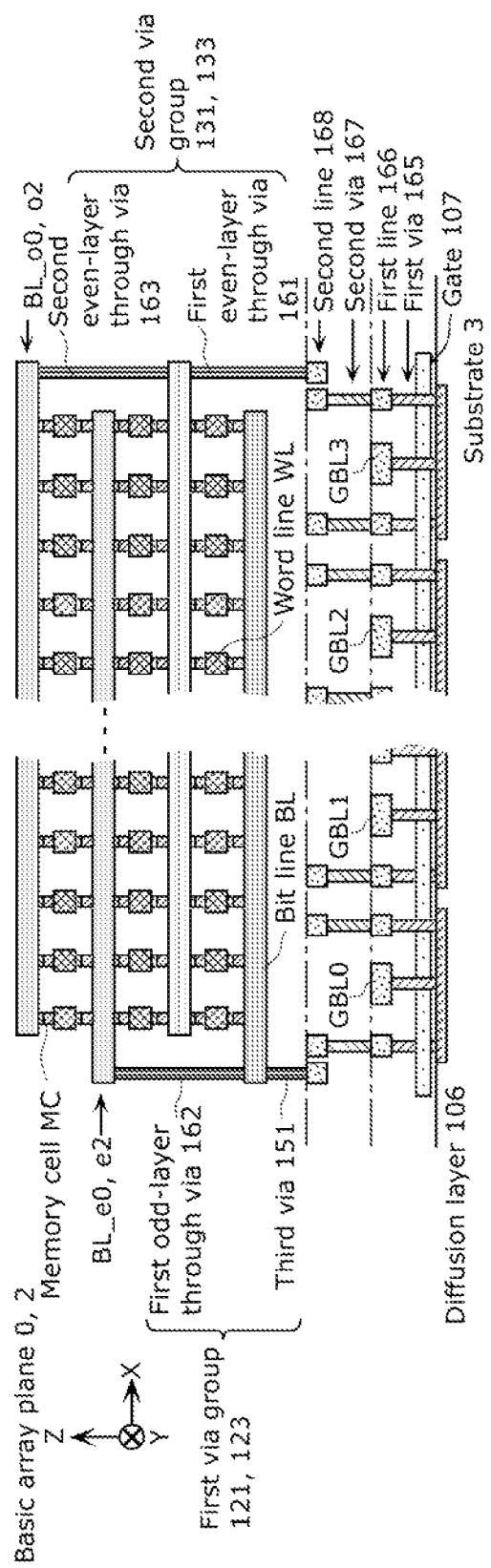
FIG. 14A is a cross-sectional view showing the physical structure of the basic array plane group (basic array planes 0 and 2) according to the present invention.
Figure 14B:
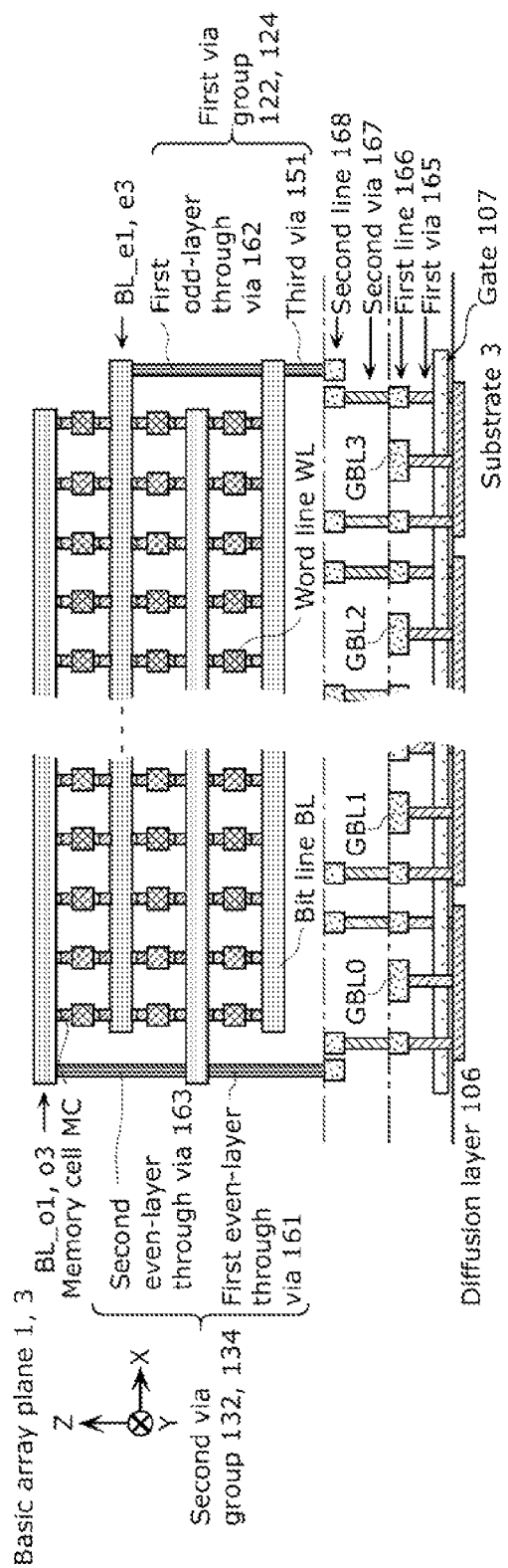
FIG. 14B is a cross-sectional view showing the physical structure of the basic array plane group (basic array planes 1 and 3) according to the present invention.

FIGS. 13, 14A, and 14B show an embodiment of a physical structure of a basic array plane group according to the present embodiment. FIG. 13 is a plan view, and FIGS. 14A and 14B are cross-sectional views. In FIG. 13, a horizontal direction is the X direction in which bit lines BL extend, a vertical direction is the Y direction in which word lines WL extend, and the direction orthogonal to the plane of the drawing is the Z direction. In FIGS. 14A and 14B, a horizontal direction is the X direction in which bit lines BL extend, a vertical direction is the Z direction, and a direction orthogonal to the plane of the drawings is the Y direction in which word lines WL extend.

In the physical structure shown in FIGS. 13, 14A, and 14B, a basic array plane group in which a plurality of memory cells MC are arranged is formed above a substrate 3. Global bit lines GBL0 to GBL3 are formed to extend in the Y direction in a layer (layer of first lines 166) under bit lines BL in the undermost layer. Further, each of the first and second selection switch elements includes a metal-oxide-semiconductor field-effect transistor (MOSFET), and is composed of diffusion layers 106 and a gate 107 that are formed over the substrate 3, and under the global bit lines GBL0 to GBL3. The global bit lines GBL0 to GBL3 and the diffusion layers 106 are connected via first vias 165.

Further, in the basic array planes 0 to 3, bit lines BL in even layers (here, bit lines in two layers) are commonly connected via a corresponding one of the first via groups 121 to 124 (first odd-layer through vias 162) that connect the even-layer bit lines (BL_e0 to BL_e3). Similarly, bit lines BL in odd layers (here, bit lines in two layers) are commonly connected via a corresponding one of the second via groups 131 to 134 (second even-layer through vias 163) that connect the odd-layer bit lines (BL_o0 to BL_o3). Then, each set of the even-layer bit lines BL_e0 to BL_e3 that are commonly connected is connected to a second line 168 via a third via (via 151), and each set of the odd-layer bit lines BL_o0 to BL_o3 that are commonly connected is connected to a second line 168 via a first even-layer through via (via 161).

Here, FIG. 14A shows a cross-sectional view of the basic array planes 0 and 2, and FIG. 14B shows a cross-sectional view of the basic array planes 1 and 3. As shown in FIG. 14A, in the basic array planes 0 and 2, the first via groups 121 and 123 that respectively connect the even-layer bit lines BL_e0 and BL_e2 to the second line 168 are arranged on the left side in the basic array planes, and the second via groups 131 and 133 that respectively connect the odd-layer bit lines BL_o0 and BL_o2 to the second line 168 are arranged on the right side in the basic array planes. In contrast, as shown in FIG. 14B, in the basic array planes 1 and 3, the first via groups 122 and 124 that respectively connect the even-layer bit lines BL_e1 and BL_e3 to the second line 168 are arranged on the right side in the basic array planes, and the second via groups 132 and 134 that respectively connect the odd-layer bit lines BL_o1 and BL_o3 to the second line 168 are arranged on the left side in the basic array planes.

FIGS. 15A to 15C and 16A to 16C are plan views each of which shows a layer obtained by dividing the physical structure shown in FIGS. 13, 14A, and 14B. The physical structure of the basic array plane group according to the present embodiment is described in more detail, using FIGS. 15A to 15C and 16A to 16C.

Figure 15A:
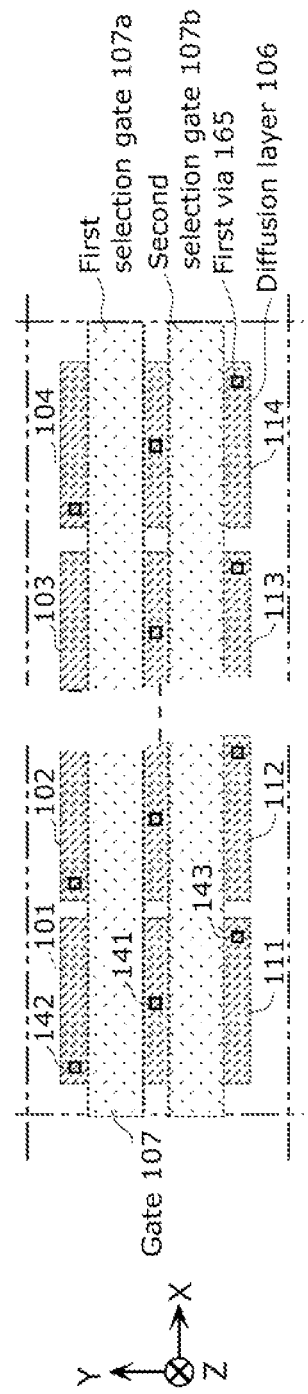
FIG. 15A shows an example of a plan view showing a layer obtained by dividing the physical structure of the basic array plane group according to the present invention.

FIG. 15A is a plan view showing a state in which diffusion layers and gates that are included in the first and second selection switch elements and the first vias 165 are formed. As shown in FIG. 15A, each of the first selection switch elements 101 to 104 and the second selection switch elements 111 to 114 shown in FIG. 6 includes a MOSFET composed of the diffusion layers 106 and the gate 107 (107a and 107b). Further, a MOSFET included in the first selection switch element 101 and the second selection switch element 111 in the basic array plane 0 shares one of diffusion regions serving as a sauce or a drain, and forms a MOSFET pair. Similarly, each set of the first selection switch element 102 and the second selection switch element 112 in the basic array plane 1, the first selection switch element 103 and the second selection switch element 113 in the basic array plane 2, and the first selection switch element 104 and the second selection switch element 114 in the basic array plane 3 shares a diffusion region, and forms a MOSFET pair.

Four MOSFET pairs are arranged such that the gate length direction thereof is the same direction as the Y direction, and arranged in the X direction. It should be noted that the number of MOSFET pairs corresponds to the number of basic array planes in a basic array plane group, and in the case of n basic array planes (n is an integer of 2 or greater), n MOSFET pairs will be aligned.

Further, in the four MOSFET pairs, the gates of the MOSFETs included in the first selection switch elements 101 to 104 are connected to one another to form the first selection gate 107a, and also the gates of the second selection switch elements 111 to 114 are connected to one another to form the second selection gate 107b. The first bit line selection signal BLs_f0 is applied to the first selection gate 107a, and the second bit line selection signal BLs_s0 is applied to the second selection gate 107b.

The first vias 165 (such as vias 141) for connecting to the global bit lines GBL0 to GBL3 are respectively formed in the shared diffusion regions in the MOSFET pairs. Further, the first vias 165 (such as vias 142) for connecting to the bit lines BL_e0, BL_o1, BL_e2, and BL_o3 are respectively formed in the other diffusion regions of the first selection switch elements 101 to 104, and the first vias 165 (such as vias 143) for connecting to the bit lines BL_o0, BL_e1, BL_o2, and BL_e3 are respectively formed in the other diffusion regions of the second selection switch elements 111 to 114.

Figure 15B:
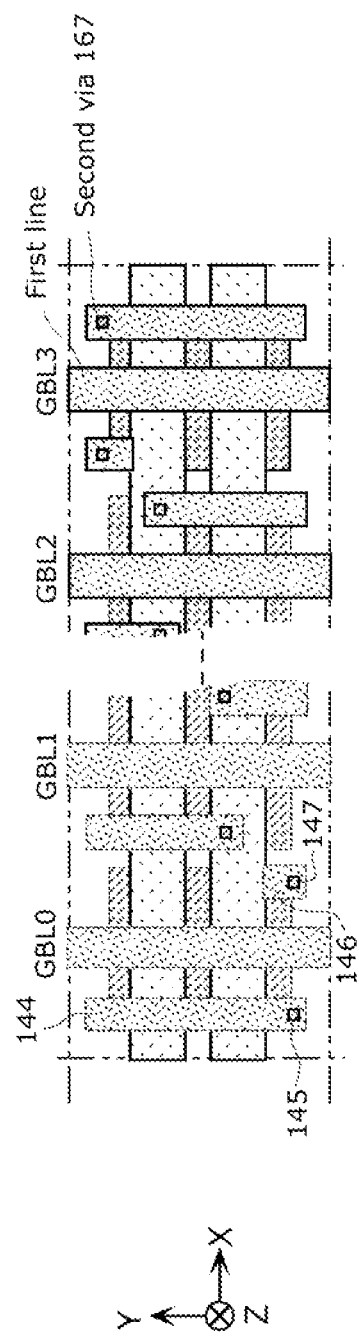
FIG. 15B shows an example of a plan view showing a layer obtained by dividing the physical structure of the basic array plane group according to the present invention.

FIG. 15B is a plan view showing a state in which the first lines 166 including the global bit lines and second vias 167 are formed over the structure in FIG. 15A. As shown in FIG. 15B, each of the global bit lines GBL0 to GBL3 extends in the Y direction, and is connected to the shared diffusion region in a corresponding MOSFET pair via the first via 165 (such as via 141). Further, lines (such as lines 144) connected to the other diffusion regions of the first selection switch elements 101 to 104 via the first vias 165 are provided. In addition, the second vias 167 (such as vias 145) for connecting to the bit lines BL_e0, BL_o1, BL_e2, and BL_o3 are formed in the lines. Furthermore, lines (such as lines 146) connected to the other diffusion regions of the second selection switch elements 111 to 114 via the first vias 165 (such as vias 143) are provided. In addition, the second vias 167 (such as vias 147) for connecting the lines (such as lines 146) to the bit lines BL_o0, BL_e1, BL_o2, and BL_e3 are formed.

Figure 15C:
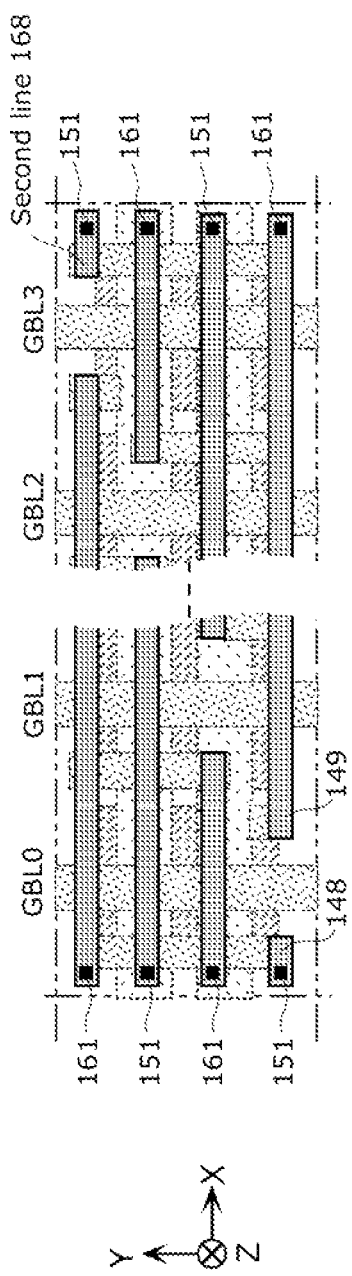
FIG. 15C shows an example of a plan view showing a layer obtained by dividing the physical structure of the basic array plane group according to the present invention.

FIG. 15C is a plan view showing the state in which the second lines 168, the third vias, and the first even-layer through vias are formed over the structure in FIG. 15B. The second lines 168 are formed in a wiring layer provided between the global bit lines GBL and the basic array plane group. As shown in FIG. 15C, the third vias 151 of the basic array planes 0 and 2 and the first even-layer through vias 161 of the basic array planes 1 and 3 are aligned in the Y direction at the left ends of the second lines 168, and the first even-layer through vias 161 of the basic array planes 0 and 2 and the third vias 151 of the basic array planes 1 and 3 are aligned in the Y direction at the right ends of the second lines 168. Specifically, respective via regions for common connection of even-layer bit lines BL_e0 commonly connected in the basic array plane 0, the odd-layer bit lines BL_o1 commonly connected in the basic array plane 1, the even-layer bit lines BL_e2 commonly connected in the basic array plane 2, and the odd-layer bit lines BL_o3 commonly connected in the basic array plane 3 are disposed to be adjacent to each other in the Y direction at the left ends of the second lines 168, and also respective via regions for common connection of the odd-layer bit lines BL_o0 commonly connected in the basic array plane 0, the even-layer bit lines BL_e1 commonly connected in the basic array plane 1, the odd-layer bit lines BL_o2 commonly connected in the basic array plane 2, and the even-layer bit lines BL_e3 commonly connected in the basic array plane 3 are disposed to be adjacent to each other in the Y direction at the right ends of the second lines 168. Further, as is clear from the cross-sectional views of FIGS. 14A and 14B, the via groups of the bit lines BL that are commonly connected extend in a direction perpendicular to the substrate 3 from the via regions in the wiring layer.

In addition, lines (such as lines 148) are provided to connect the third vias 151 to the second vias 167 (such as vias 145) connected to the other diffusion regions of the selection switch elements 101, 112, 103, and 114. Further, lines (such as lines 149) are provided to connect the first even-layer through vias to the second vias 167 (such as vias 147) connected to the other diffusion regions of the second selection switch elements 111, 102, 113, and 104. Accordingly, the vias 151 and 161 are respectively connected to unshared diffusion regions of the first selection switch elements 101 to 104 and the second selection switch elements 111 to 114.

In this manner, a wiring layer is provided between the global bit lines and the basic array plane group, and the lines in this wiring layer are caused to be interposed for the electrical connection between the commonly-connected bit lines and the selection switch elements. Consequently, the arrangement of the selection switch elements is not restricted due to the arrangement of the bit line contact regions, thus enabling the arrangement and a size configuration with high flexibility.

Figure 16A:
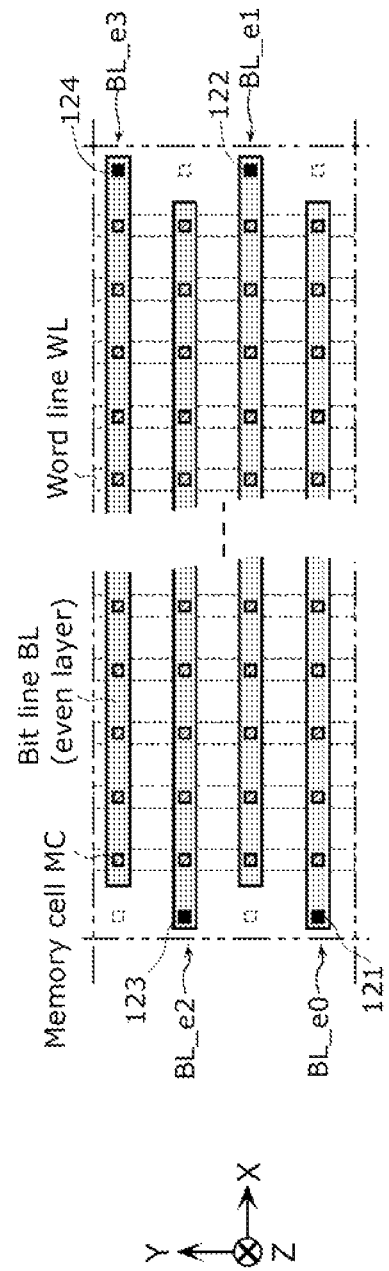
FIG. 16A shows an example of a plan view showing a layer obtained by dividing the physical structure of the basic array plane group according to the present invention.

FIG. 16A is a plan view showing the even-layer bit lines formed above the structure in FIG. 15C. As shown in FIG. 16A, the even-layer bit lines BL (BL_e0 to BL_e3) are commonly connected via the first via groups 121 to 124 that connect the bit lines in even layers in the common Z direction, and are further connected to the third vias 151 shown in FIG. 15C. It should be noted that memory cells MC are represented using rectangles in FIG. 16A and other plan views, but have a circular shape in the actual finished dimension.

Here, at the point in time when even-layer bit lines are formed, odd-layer through vias are not formed (dotted-line squares in the drawing), and the interval between the sets of the even-layer bit lines in the via regions is twice as much as the interval between the basic array planes (in the drawing, between BL_e0 and BL_e2 and between BL_e1 and BL_e3), which achieves an advantage of allowing a process to be performed with ease.

Figure 16B:
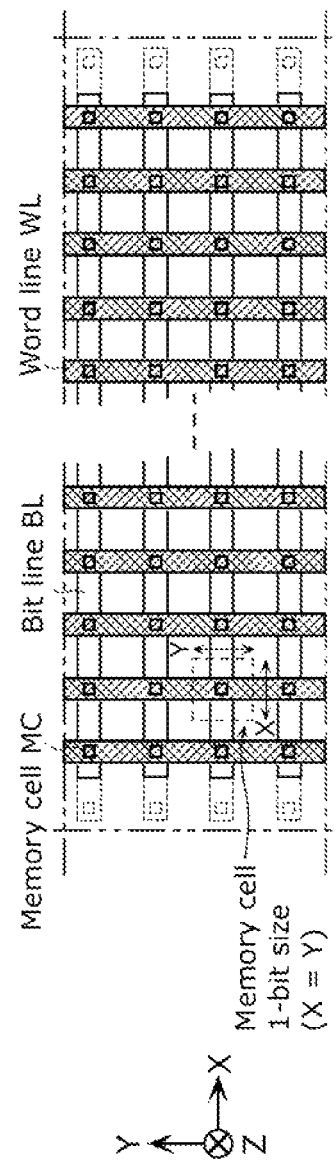
FIG. 16B shows an example of a plan view showing a as layer obtained by dividing the physical structure of the basic array plane group according to the present invention.

FIG. 16B is a plan view showing word lines formed above the structure of FIG. 15C. Further, in FIG. 16B, a dashed-line rectangle shows a 1-bit (pitch) size of a memory cell MC. Although the pitch in the X direction (bit line direction) is the same as the pitch in the Y direction (word line direction) here, the pitches do not need to be the same.

Figure 16C:
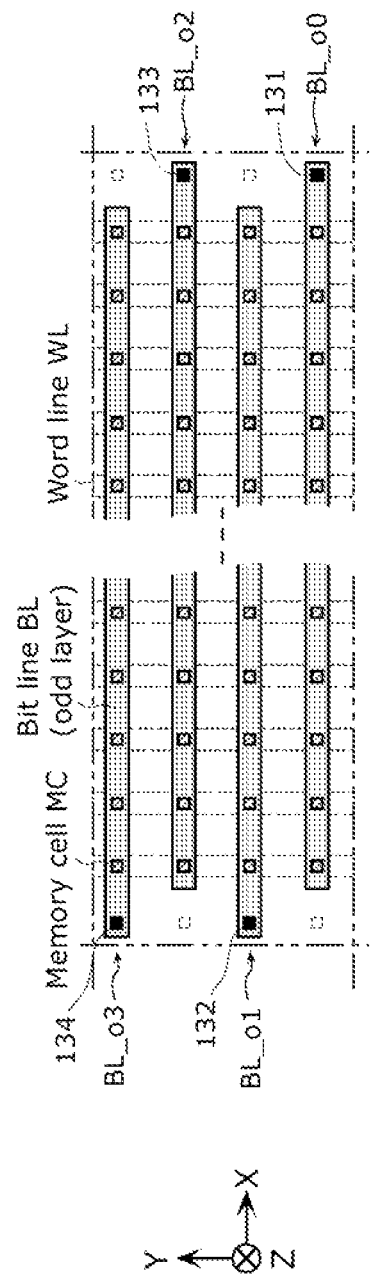
FIG. 16C shows an example of a plan view showing a layer obtained by dividing the physical structure of the basic array plane group according to the present invention.
Figure 17A:
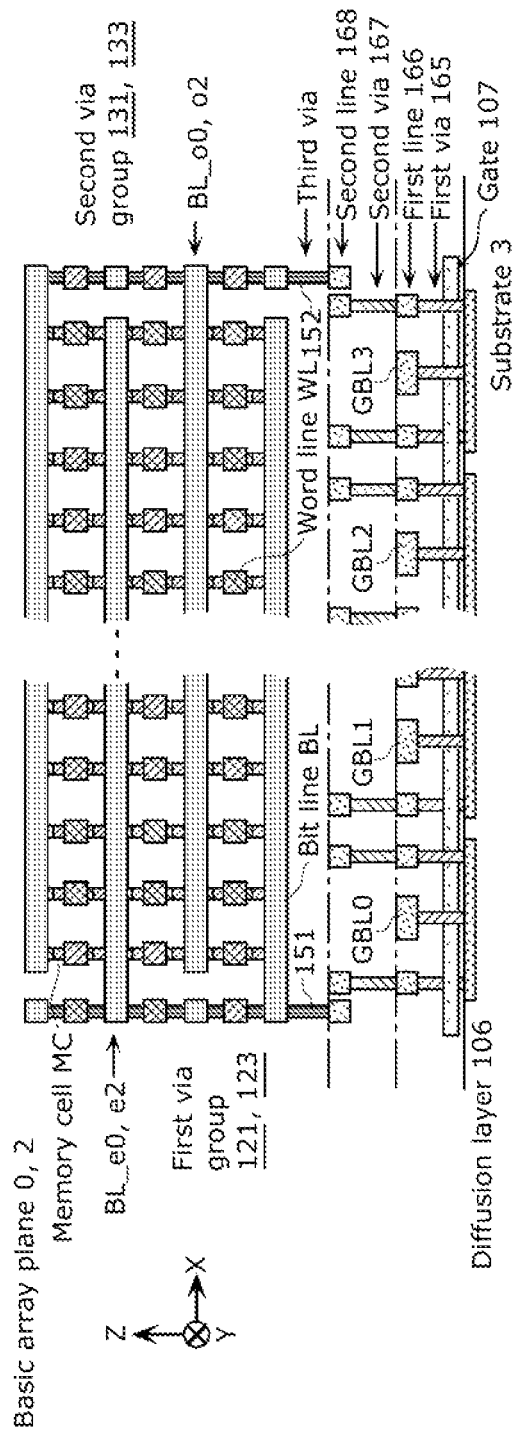
FIG. 17A is a cross-sectional view showing the physical structure of the basic array plane group (basic array planes 0 and 2) according to the present invention.
Figure 17B:
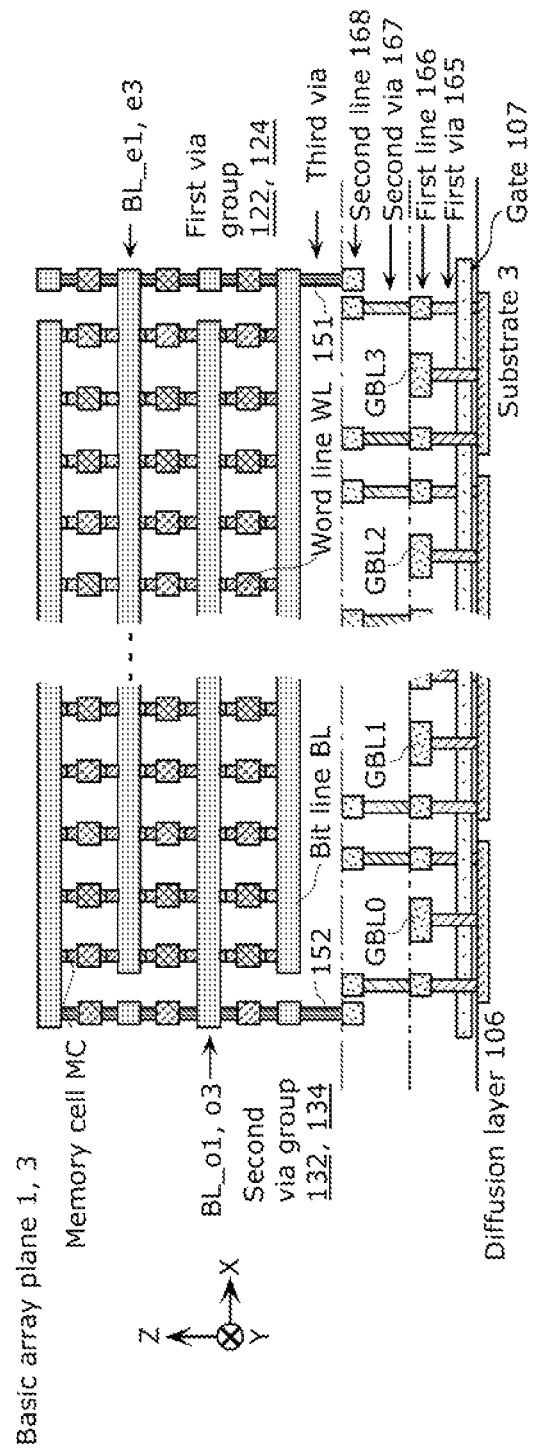
FIG. 17B is a cross-sectional view showing the physical structure of the basic array plane group (basic array planes 1 and 3) according to the present invention.
Figure 18A:
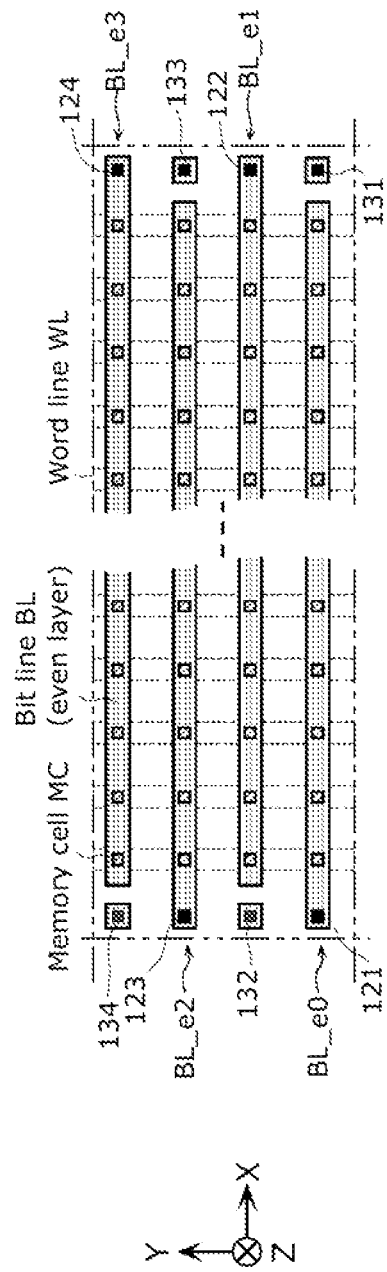
FIG. 18A shows an example of a plan view showing a layer obtained by dividing the physical structure of the basic array plane group according to the present invention.
Figure 18B:
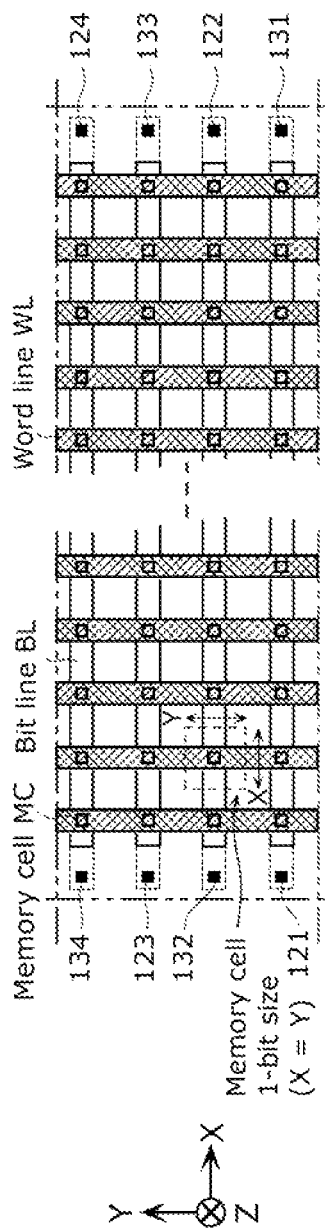
FIG. 18B shows an example of a plan view showing a layer obtained by dividing the physical structure of the basic array plane group according to the present invention.
Figure 18C:
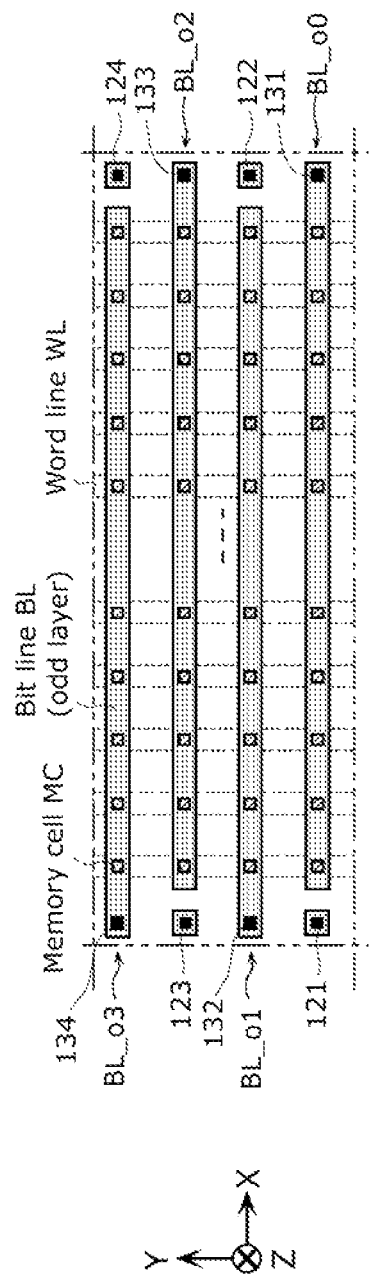
FIG. 18C shows an example of a plan view showing a layer obtained by dividing the physical structure of the basic array plane group according to the present invention.

FIG. 16C is a plan view showing odd-layer bit lines formed above the structure in FIG. 15C. As shown in FIG. 16C, the odd-layer bit lines BL (BL_o0 to BL_o3) are commonly connected via the second via groups 131 to 134 that connect the bit lines in odd layers in the common Z direction, and are further connected to the first even-layer through vias 161 shown in FIG. 15C.

Further, at the point in time when the odd-layer bit lines are formed, the even-layer through vias are not formed (dotted-line squares in the drawing), and the interval between the sets of the odd-layer bit lines in the via regions is twice as much as the interval between the basic array planes (in the drawing, between BL_o0 and BL_o2 and between BL_o1 and BL_o3), which achieves an advantage of allowing a process to be performed with ease.

It should be noted that each of the first via groups 121 to 124 and the second via groups 131 to 134 may be formed by disposing, in layers of word lines and bit lines that are not connected to the via group, separate wiring patterns for connecting upper and lower vias, and connecting the wiring layers using the vias, as shown in FIGS. 17A, 17B, and 18A to 18C.

<Feature of Variable Resistance Nonvolatile Memory Device 500 According to Present Invention>

In considering the structure of multilayer hierarchical bit lines, inventors of the present invention noted the following points.

As the first point, the inventors thought that variations in the read speed can be reduced by arranging and controlling lines such that during a reading operation, the behavior of signals is always the same in unselected bit lines adjacent to a selected bit line on both sides in the Y direction, irrespective of the position of the selected bit line.

In the variable resistance nonvolatile memory device 500 according to the present invention, bit lines and bit line selection switches are arranged and controlled such that when an even-layer bit line is selected in a certain basic array plane, even-layer bit lines in basic array planes adjacent on both sides in the Y direction are always disconnected from respective global bit lines, whereas when an odd-layer bit line is selected in a certain basic array plane, odd-layer bit lines in basic array planes adjacent on both sides in the Y direction are always disconnected from respective global bit lines, thereby causing the behavior of signals to be always the same in unselected bit lines adjacent on both sides in the Y direction, irrespective of the position of a bit line to be selected. This line arrangement and control enables a reduction in variations in the read speed depending on a selected position, and thus bit lines can be wired at minimum intervals.

As the second point, the inventors conceived the physical structure of vias in which in the Z direction that is a layer stacking direction, even-layer bit lines adjacent to each other with an odd layer interposed therebetween are connected using a single via (such as the first odd-layer through via 162), and similarly odd-layer bit lines adjacent to each other with an even layer interposed therebetween are connected using a single via (such as the second odd-layer through via 163), thereby preventing a wiring layer from being provided in a word line or bit line layer that is not connected to a via group. With this physical structure of vias, at the point in time when forming even-layer bit lines, the first odd-layer through vias 162 are not formed, and an interval between sets of even-layer bit lines in via regions is twice as much as the interval between basic array planes, which achieves an advantage of allowing a process to be performed with ease. The same also applies to the forming of odd layers.

In the variable resistance nonvolatile memory device, there is a case in which a current used for writing and erasing needs to be limited when performing write and erase operation. An example of such a case is when the state of a variable resistance element is changed from the high resistance state to the low resistance state. In this case, it is sufficient to provide, in the configuration of the basic array plane group according to the embodiment of the present invention shown in FIG. 6, current limiting circuits 171 to 175 and 181 to 185 between the global bit lines GBL000 to GBL003 and bit line selection switch elements 101 to 105 and 111 to 115, as in FIG. 19.

Specifically, for each of the basic array planes, a current limiting circuit is composed by inserting, between a corresponding one of the global bit lines GBL000 to GBL003 and a corresponding one of the connection points of the first selection switch elements 101 to 105 and the second selection switch elements 111 to 115, a parallel circuit including a corresponding one of the pairs of the N-MOS transistors 171 to 175 and the P-MOS transistors 181 to 185. In the writing and erasing, between an N-MOS transistor and a P-MOS transistor that form a pair, only one of the transistors that performs a source follower operation is turned ON, thereby causing the transistor that is ON to operate as a current limiting circuit due to a substrate bias effect, for example. Specifically, when a current is caused to flow from a memory cell towards a global bit line, only a P-MOS transistor is turned ON, whereas when a current is caused to flow from a global bit line towards a memory cell, only an N-MOS transistor is turned ON, thereby enabling limitation of a current. Accordingly, it is possible to avoid a problem that when the state of a variable resistance element is changed from a high resistance state to a low resistance state, the resistance of the variable resistance element is excessively decreased due to an excessive current, and thus the following operations become unstable.

Figure 19:
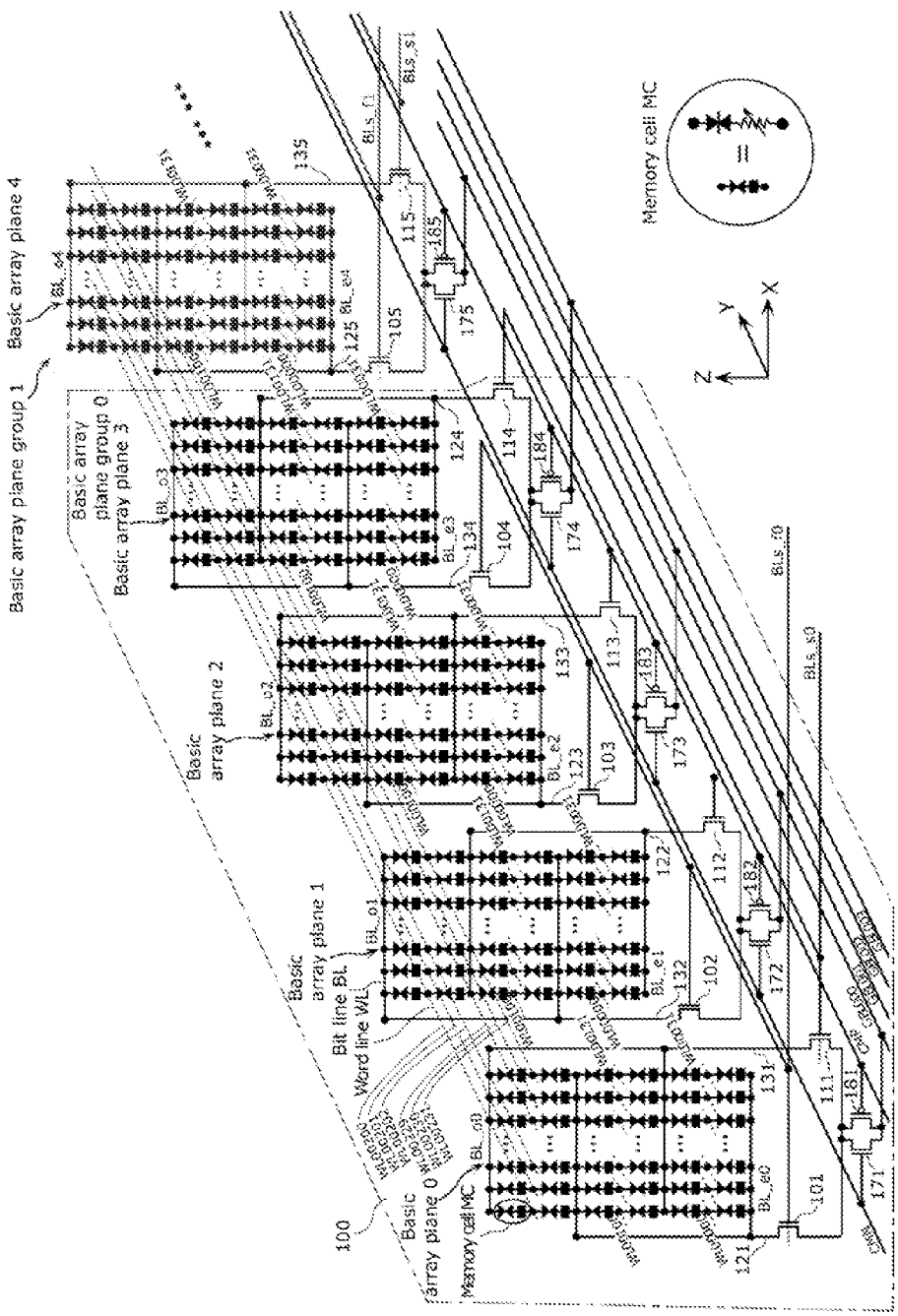
FIG. 19 is a circuit diagram showing one embodiment of the configuration of the basic array plane group according to the present invention.

It should be noted that in the memory cell array composed of a basic array plane group configured as shown in FIGS. 6 and 19, only a basic array plane at the end portion thereof (the basic array plane 0 in FIGS. 6 and 19) has one adjacent basic array plane (the basic array plane 1 in FIGS. 6 and 19), instead of two adjacent basic array planes. Therefore, although there is a concern that only when accessing the basic array plane 0 at the end portion, a read speed may be different from that when accessing another basic array plane, this concern can be solved by arranging, on the side where the basic array plane 1 is not provided, a dummy basic array plane adjacent to the basic array plane 0 in the Y direction. In this case, both the first selection switch element and the second selection switch element of the dummy basic array plane may be fixed in the OFF state so as to disconnect bit lines from global bit lines.

<Effect Achieved by Variable Resistance Nonvolatile Memory Device 500 According to Present Invention>

Next is a description of effects of the configuration of the memory cell array included in the variable resistance nonvolatile memory device 500 according to the present invention, taking particular notice of the behavior of signals in a selected bit line and an unselected bit line adjacent to the selected bit line in the Y direction during reading operation.

With the configuration of the conventional memory cell array shown in FIG. 23, depending on the position of a bit line to be selected, there are two cases, namely the case where both unselected bit lines adjacent to the selected bit line on both sides in the same wiring layer (i.e., in the Y direction) are connected to global bit lines by bit line selection switch elements (even-layer selection switch elements 401 to 405 or odd-layer selection switch elements 411 to 415), and the case where one of such unselected bit lines is connected to a global bit line by a corresponding bit line selection switch element, and the other of such unselected bit lines is disconnected from a global bit line. In contrast, the configuration of the memory cell array included in the variable resistance nonvolatile memory device 500 according to the present invention shown in FIG. 6 has a feature that irrespective of the position of a bit line to be selected, both unselected bit lines adjacent to the selected bit line on both sides in the same wiring layer (i.e., in the Y direction) are disconnected from global bit lines by bit line selection switch elements (the first selection switch elements 101 to 105 or the second selection switch elements 111 to 115).

Figure 20A:
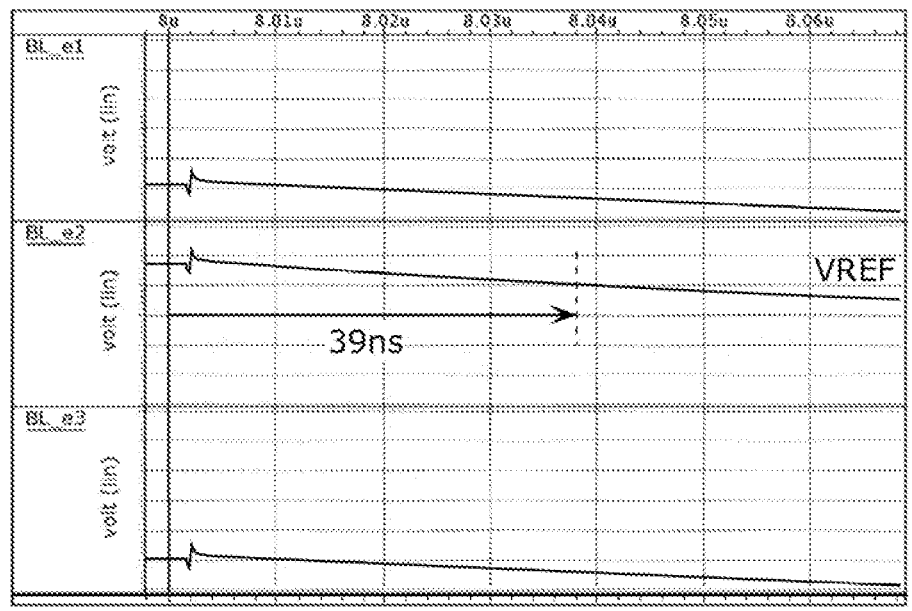
FIG. 20A is a waveform diagram showing a simulation result of a reading operation in a conventional basic array plane group (when accessing BL_e2).
Figure 20B:
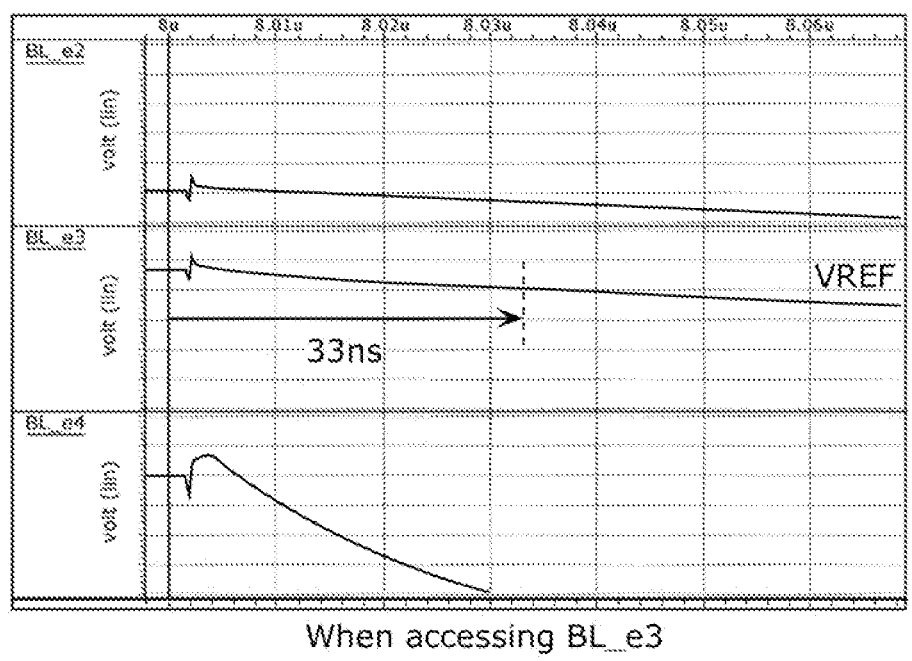
FIG. 20B is a waveform diagram showing a simulation result of the reading operation in the conventional basic array plane group (when accessing BL_e3).

With the configuration of the conventional memory cell array, depending on the position of a bit line to be selected, the behavior of signals is different in unselected bit lines adjacent on both sides in the Y direction, which causes a difference in the influence from the unselected bit lines onto the selected bit line due to interline capacitance. Accordingly, even when the resistance value of variable resistance elements of selected memory cells is the same, depending on the selected position, a difference occurs in the behavior of signals in the selected bit lines, and variations in the read speed occur. FIG. 20A shows, in the case of the configuration of the basic array plane group shown in FIG. 23, the behavior of signals in the unselected bit lines BL_e1, the selected bit lines BL_e2, and the unselected bit lines BL_e3 when reading a memory cell connected to the selected word line WL00000 and a corresponding one of the selected bit lines BL_e2, the behavior being obtained as a result of simulation. Further, FIG. 20B shows the behavior of signals in the unselected bit lines BL_e2, the selected bit lines BL_e3, and the unselected bit lines BL_e4 when reading a memory cell connected to the selected word line WL00000 and a corresponding one of the selected bit lines BL_e3, the behavior being obtained as a result of simulation. As shown in FIG. 20A, when reading the memory cell connected to the selected word line WL00000 and a corresponding one of the selected bit lines BL_e2, signals in both adjacent unselected bit lines change toward a stable voltage at a lower speed, whereas as shown in FIG. 20B, when reading the memory cell connected to the selected word line WL00000 and a corresponding one of the selected bit lines BL_e3, it can be seen that a signal in one of the adjacent unselected bit lines changes toward a stable voltage at a lower speed, and a signal in the other changes toward a stable voltage at a higher speed. As described above, since there is a difference in the behavior of signals in unselected bit lines adjacent in the Y direction, a read time when reading the memory cell connected to the selected word line WL00000 and a corresponding one of the selected bit lines BL_e2 is 39 ns, whereas a read time when reading the memory cell connected to the selected word line WL00000 and a corresponding one of the selected bit lines BL_e3 is 33 ns. Thus, it can be seen that there is a difference of 6 ns depending on the selected position.

Figure 21A:
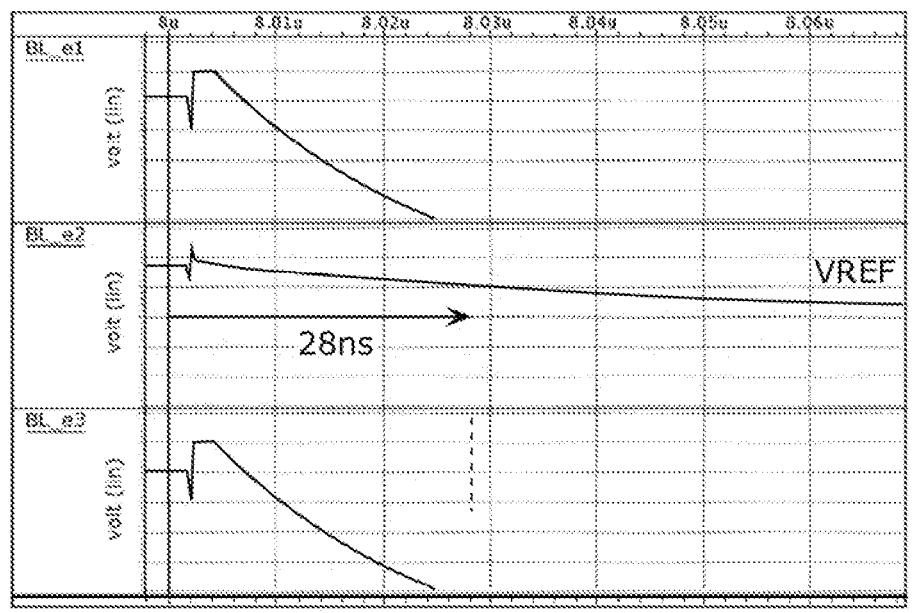
FIG. 21A is a waveform diagram showing a simulation result of the reading operation in the basic array plane group according to the present invention (when accessing BL_e2).
Figure 21B:
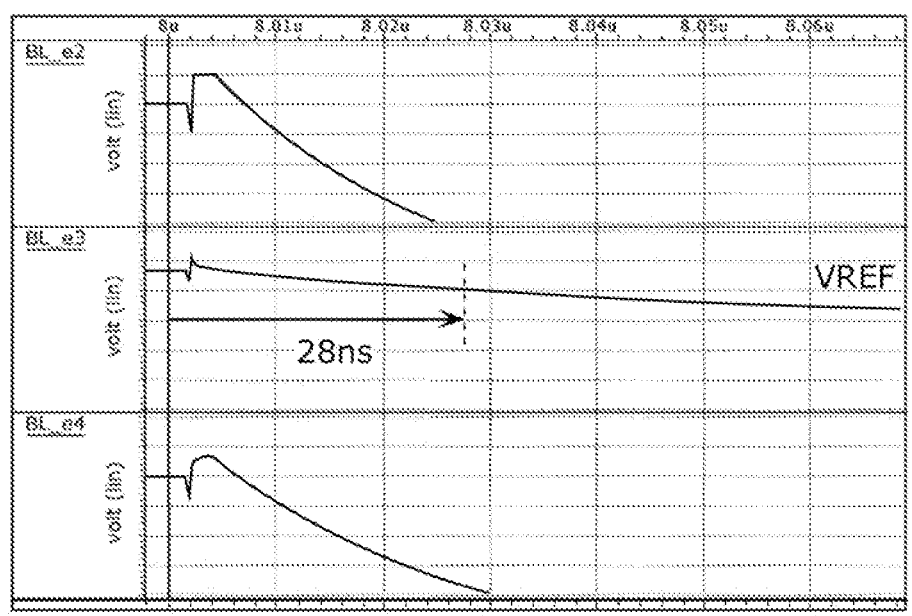
FIG. 21B is a waveform diagram showing a simulation result of the reading operation in the basic array plane group according to the present invention (when accessing BL_e3).
Figure 22:
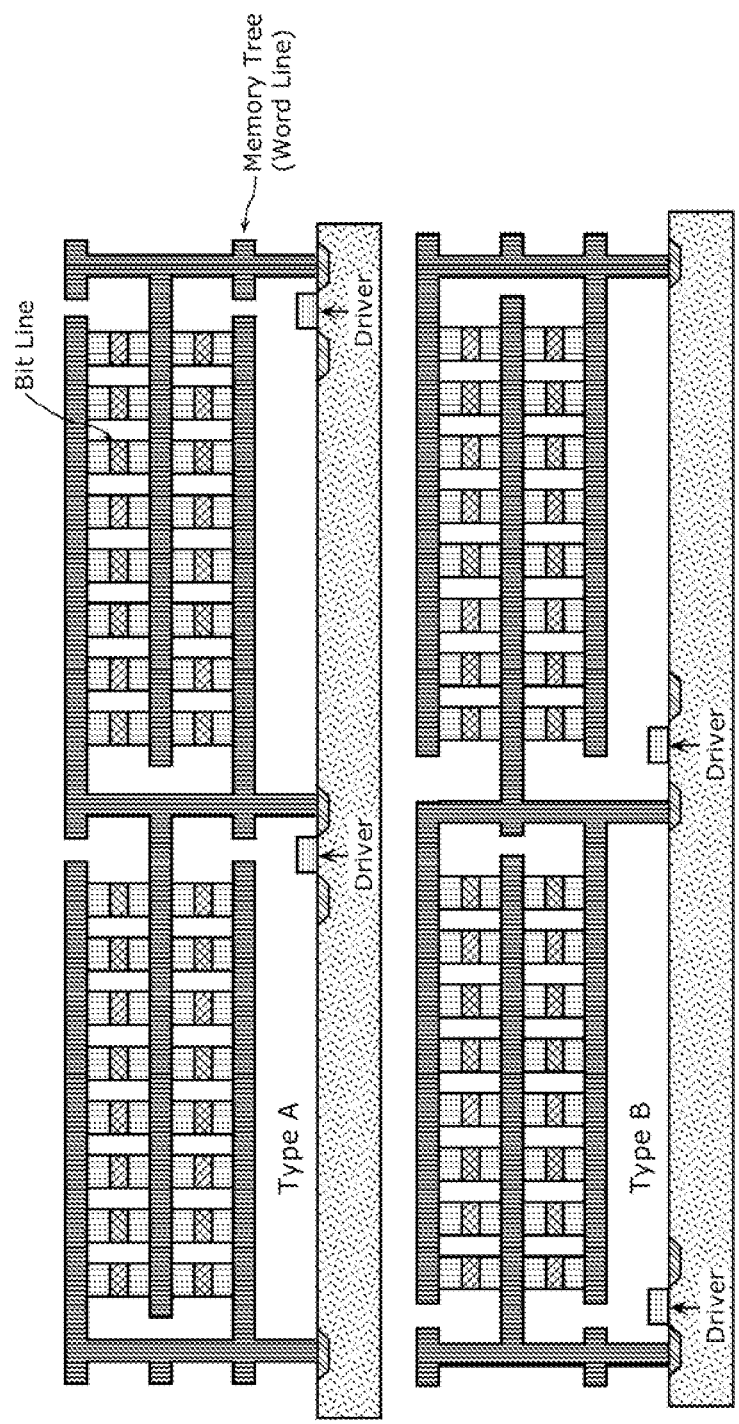
FIG. 22 is a cross-sectional view showing a configuration of a conventional basic array plane.

On the other hand, with the configuration of the memory cell array included in the variable resistance nonvolatile memory device 500 according to the present invention, irrespective of the position of a bit line to be selected, the behavior of signals is the same in unselected bit lines adjacent on both sides in the Y direction, and there is no difference in the influence on the selected bit line due to interline capacitance. Accordingly, when the resistance value of variable resistance elements of selected memory cells is the same, there is no difference in the behavior of signals in selected bit lines depending on the selected position, and thus variations in the read speed do not occur. FIGS. 21A and 21B show, in the case of the configuration of the basic array plane group shown in FIG. 6, the behavior of signals in a selected bit line and adjacent unselected bit lines in both the cases where a memory cell connected to the selected word line WL00000 and a corresponding one of the selected bit lines BL_e2 is read and where a memory cell connected to the selected word line WL00000 and a corresponding one of the selected bit lines BL_e3 is read as in the case of FIG. 20, the behavior being obtained as a result of simulation. In both of the cases of FIGS. 21A and 21B, it can be seen that signals in both adjacent unselected bit lines show a change to a stable voltage at a higher speed. Accordingly, a read time when reading the memory cell connected to the selected word line WL00000 and a corresponding one of the selected bit lines BL_e2 is 28 ns, and a read time when reading the memory cell connected to the selected word line WL00000 and a corresponding one of the selected bit lines BL_e3 is also 28 ns, which shows that selected positions do not make a difference.

As described above, with the configuration of the memory cell array included in the variable resistance nonvolatile memory device according to the present invention, a read time is fixed, irrespective of the position to be selected, and it is not necessary to take into consideration the influence exerted by the behavior of a signal in an unselected bit line due to interline capacitance. Thus, it is possible to wire bit lines at minimum intervals without providing an extra margin in a read circuit. Further, although the above results are examples in the case of the basic array plane group shown in FIG. 6, if the number of wiring layers and the number of memory cells on the same bit line is further increased compared to those in the case of FIG. 6, the influence exerted due to interline capacitance will be more noticeable. Thus, the configuration of the memory cell array included in the variable resistance nonvolatile memory device according to the present invention which does not need to take such an influence into consideration will be more useful.

Although the above is a description of the variable resistance nonvolatile memory device according to the present invention based on an embodiment and the modification thereof, the present invention is not limited to the embodiment and the modification. Modifications obtained by applying various changes that can be conceived by a person skilled in the art to the embodiment and the modification and any combinations of the constituent elements in the embodiment and the modification are also included in the present invention without departing from the scope of the present invention.

For example, although the memory cell array included in the variable resistance nonvolatile memory device in the present embodiment shown in FIG. 6 is composed of a plurality of basic array groups, and each basic array group is composed of four basic array planes, the memory cell array included in the variable resistance nonvolatile memory device according to the present invention is not limited to such a configuration, and may be composed of at least one basic array group only, or one basic array group may be composed of at least two basic arrays. It is because if a memory cell array is composed of at least two basic array planes, a feature can be achieved that a first via group in a first basic array plane (a via group that connects even-layer bit lines) and a second via group in a second basic array plane (a via group that connects odd-layer bit lines) are adjacent to each other in the Y direction, and a second via group in the first basic array plane and a first via group in the second basic array plane are adjacent to each other in the Y direction.

INDUSTRIAL APPLICABILITY

As described above, a variable resistance nonvolatile memory device according to the present invention is useful to realize, for example, a high-integration and small-area memory, since it is possible to include a memory cell arrays using minimum wiring intervals in the configuration of a multi-divided memory cell array.

REFERENCE SIGNS LIST

MC Memory cell
BL Bit line
WL Word line
GBL Global bit line
BL_e0 to BL_e4 Even-layer bit line
BL_o0 to BL_o4 Odd-layer bit line
BLs_f0, BLs_f1 First bit line selection signal
BLs_s0, BLs_s1 Second bit line selection signal
BLs_e0, BLs_e1 Even-layer selection signal
BLs_o0, BLs_o1 Odd-layer selection signal
CMP Current-limiting-control signal
1 Variable resistance element
2 Bidirectional diode element
2a Unidirectional diode element
11 Lower wire
12 Upper wire
13 Lower electrode
14 Diode layer
15 Internal electrode
16 Variable resistance layer
16a First variable resistance layer (first tantalum oxide layer, first hafnium oxide layer, first zirconium oxide layer)
16b Second variable resistance layer (second tantalum oxide layer, second hafnium oxide layer, second zirconium oxide layer)
17 Upper electrode
100 Basic array plane group
101 to 105 First selection switch element
106 Diffusion layer
107 Gate
107a First selection gate
107b Second selection gate
111 to 115 Second selection switch element
121 to 125 First via group
131 to 135 Second via group
141 to 143, 145, 147, 151, 161 Via
144, 146, 148, 149 Line
171 to 175, 181 to 185 Current limiting circuit (N-MOS transistor, P-MOS transistor)
200 Memory cell array
201 Word line decoder/driver
202 Global bit line decoder/driver
203 Sub-bit line selection circuit
211 Address input circuit
212 Control circuit
213 Write pulse generation circuit
214 Write circuit
215 Data input-output circuit
216 Read circuit
300 Main part
400 Basic array plane group
401 to 405 Even-layer selection switch element
411 to 415 Odd-layer selection switch element
421 to 425 Even-layer contact via
431 to 435 Odd-layer contact via

The invention claimed is:
1. A variable resistance nonvolatile memory device including memory cells each having a variable resistance element, a resistance state of which reversibly changes based on an electrical signal, said device comprising:
a substrate;
bit lines in a plurality of layers which are stacked in a Z direction, and in which said bit lines extending in an X direction are aligned in a Y direction, the X and Y directions being directions orthogonal to each other on a plane parallel to a main surface of said substrate, and the Z direction being a direction in which the layers are stacked above the main surface of said substrate;

word lines in a plurality of layers which are stacked in the Z direction and formed at respective intervals between the layers of said bit lines, and in which said word lines extending in the Y direction are aligned in the X direction;

a memory cell array having said memory cells which are formed at respective crosspoints of said bit lines in the layers and said word lines in the layers, and each of which is interposed between a corresponding one of said bit lines and a corresponding one of said word lines, said memory cell array including a plurality of basic array planes aligned in the Y direction, and each of said basic array planes having memory cells included in said memory cells and interposed between, among said bit lines in the layers, bit lines in the layers at the same position in the Y direction and said word lines crossing said bit lines at the same position;

global bit lines provided in one-to-one correspondence with said basic array planes; and sets of a first selection switch element and a second selection switch element, said sets being provided in one-to-one correspondence with said basic array planes, wherein each of said basic array planes further includes a first via group interconnecting only even-layer bit lines among said bit lines in said basic array plane, and a second via group interconnecting only odd-layer bit lines among said bit lines in said basic array plane, and for each of said basic array planes, said first via group in said basic array plane is connected to said global bit line corresponding to said basic array plane via one of said first selection switch element and said second selection switch element that are included in said set corresponding to said basic array plane, and said second via group in said basic array plane is connected to said corresponding global bit line via the other of said first selection switch element and said second selection switch element that are included in said corresponding set, and when one of said basic array planes is a first basic array plane, and a different one of said basic array planes is a second basic array plane, said different one being adjacent to said first basic array plane in the Y direction, said first via group in said first basic array plane and said second via group in said second basic array plane are adjacent to each other in the Y direction, and said second via group in said first basic array plane and said first via group in said second basic array plane are adjacent to each other in the Y direction, said first via group in said first basic array plane is connected to said global bit line corresponding to said first basic array plane via said first selection switch element corresponding to said first basic array plane, and said second via group in said first basic array plane is connected to said corresponding global bit line via said second selection switch element corresponding to said first basic array plane, said second via group in said second basic array plane is connected to said global bit line corresponding to said second basic array plane via said first selection switch element corresponding to said second basic array plane, and said first via group in said second basic array plane is connected to said corresponding global bit line via said second selection switch element corresponding to said second basic array plane, and in said sets which correspond to said basic array planes, and each of which includes said first selection switch element and said second selection switch element, electrical connection and disconnection of said first selection switch elements are controlled by a first common bit line selection signal, and electrical connection and disconnection of said second selection switch elements are controlled by a second common bit line selection signal.

2. The variable resistance nonvolatile memory device according to claim 1, wherein for each of said basic array planes, said first via group in said basic array plane connects all said even-layer bit lines in said basic array plane using a single via, and said second via group in said basic array plane connects all said odd-layer bit lines in said basic array plane using a single via, said even-layer bit lines being adjacent to each other in the Z direction with said odd-layer bit lines in said basic array plane interposed, and said odd-layer bit lines being adjacent to each other in the Z direction with said even-layer bit lines in said basic array plane interposed.

3. The variable resistance nonvolatile memory device according to claim 1, further comprising, for each of said basic array planes, a current limiting circuit between said global bit line corresponding to said basic array plane and terminals, one of the terminals being a terminal of said first selection switch element corresponding to said basic array plane and the other of the terminals being a terminal of said second selection switch element corresponding to said basic array plane.

4. The variable resistance nonvolatile memory device according to claim 1, further comprising:

a global bit line decoder/driver that selects at least one of said global bit lines, and applies a read voltage to said at least one selected global bit line;

a read circuit that reads the resistance state of a memory cell in said basic array plane corresponding to said at least one global bit line selected by said global bit line decoder/driver; and a control circuit that controls said global bit line decoder/driver, wherein when an operation of reading from a memory cell in said first basic array plane is performed, said control circuit controls said global bit line decoder/driver such that an operation of reading from a memory cell in said second basic array plane is prevented from being simultaneously performed.

5. The variable resistance nonvolatile memory device according to claim 4, wherein when the operation of reading from a memory cell in said first basic array plane is performed, said control circuit further controls said global bit line decoder/driver such that an operation of reading from a memory cell in a third basic array plane is simultaneously performed, said third basic array plane not being adjacent to said first basic array plane in the Y direction.

* * * * *